(12) United States Patent
Jeon et al.

(10) Patent No.: US 12,717,450 B2
(45) Date of Patent: Aug. 25, 2026

(54) ELECTRONIC DEVICE WITH INPUT SENSOR AND NON-OVERLAPPING CHARGING ELECTRODE

(71) Applicant: SAMSUNG DISPLAY CO., LTD., Yongin-si (KR)

(72) Inventors: Hyunjee Jeon, Yongin-si (KR); Sanghyun Lim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/888,989

(22) Filed: Sep. 18, 2024

(65) Prior Publication Data

US 2025/0216991 A1 Jul. 3, 2025

(30) Foreign Application Priority Data

Dec. 28, 2023 (KR) ........................ 10-2023-0194846

(51) Int. Cl.

| | |
|---|---|
| ***G06F 3/044*** | (2006.01) |
| ***G06F 3/041*** | (2006.01) |
| ***G06F 3/046*** | (2006.01) |
| ***H10K 59/131*** | (2023.01) |
| ***H10K 59/40*** | (2023.01) |
| *G09G 3/32* | (2016.01) |

(52) U.S. Cl.

CPC .......... *G06F 3/0445* (2019.05); *G06F 3/0412* (2013.01); *G06F 3/046* (2013.01); *H10K 59/131* (2023.02); *H10K 59/40* (2023.02); *G06F 3/0446* (2019.05); *G06F 2203/04106* (2013.01); *G06F 2203/04107* (2013.01); *G06F 2203/04111* (2013.01); *G09G 3/32* (2013.01); *G09G 2300/0439* (2013.01); *G09G 2330/06* (2013.01)

(58) Field of Classification Search

CPC .... G06F 3/0445; G06F 3/0412; G06F 3/0446; G06F 3/046; G06F 2203/04107; G06F 2203/04111; G06F 2203/04106; G09G 3/32; G09G 2300/0439; G09G 2330/06; H10K 59/40; H10K 59/131

See application file for complete search history.

(56) References Cited

U.S. PATENT DOCUMENTS

| | | | | |
|---|---|---|---|---|
| 11,385,739 | B2 | 7/2022 | Kurasawa et al. | |
| 2022/0091632 | A1* | 3/2022 | Hong | H10K 59/40 |
| 2023/0067179 | A1* | 3/2023 | Kim | G06F 1/1641 |
| 2025/0085825 | A1* | 3/2025 | Yan | G06F 3/0412 |

FOREIGN PATENT DOCUMENTS

| | | |
|---|---|---|
| CN | 109085949 | 12/2018 |
| JP | 2020095075 | 6/2020 |

* cited by examiner

*Primary Examiner* — Liliana Cerullo
(74) *Attorney, Agent, or Firm* — F. CHAU & ASSOCIATES, LLC

(57) ABSTRACT

An electronic device includes a base layer, a light emitting element, an input sensor, a driving transistor, and a charging electrode. The light emitting layer is disposed above the base layer. The input sensor is disposed above the light emitting element. The driving transistor is disposed above the base layer and located on a current path between a power line and the light emitting element. The charging electrode is disposed below the driving transistor and non-overlaps the driving transistor in a plan view. The charging electrode is configured to generate an induced magnetic field.

19 Claims, 34 Drawing Sheets

PN
1000
2000
3000
L
C
1000C
200C
200
100
200-1
1000P
100C

PXij
205
204
203
202
201
200
PDL-OP1
PDL
INS8
CNE3
INS7
CNE2
INS6
INS5
INS4
INS3
INS2
INS1
BFL
200-C
CNE1
CNE2
CNE3
CNE
DA
NLEA
LEA
NLEA
CNT-5
CNT-4
CNT-3
CNT-2
CNT-1
CNE1
OLED
AE
HCL
EML
ECL
CE
D6
A6
S6
G6
SCP6
T6
DME
BML
D1
A1
S1
G1
SCP1
T1
PCE
D4
A4
S4
G4
SCP4
T4
140
130
120
110
200-1
100

FIG. 17C

| | PSL-2 | CH1 | CH2 | CH3 | CH4 | CH5 | CH6 | CH7 | CH8 | CH9 | CH10 | PSL-3 |
|---|---|---|---|---|---|---|---|---|---|---|---|---|
| t1 | SG2 | SG1 | FL | FL | FL | FL | FL | FL | FL | FL | FL | FL |
| t2 | FL | SG2 | FL | SG1 | FL | FL | FL | FL | FL | FL | FL | FL |
| t3 | FL | FL | FL | SG2 | FL | SG1 | FL | FL | FL | FL | FL | FL |
| t4 | FL | FL | FL | FL | FL | SG2 | FL | SG1 | FL | FL | FL | FL |
| t5 | FL | FL | FL | FL | FL | FL | FL | SG2 | FL | SG1 | FL | FL |
| t6 | FL | FL | FL | FL | FL | FL | FL | FL | FL | SG2 | FL | SG1 |

FIG. 17D

|  | PSL-2 | CH1 | CH2 | CH3 | CH4 | CH5 | CH6 | CH7 | CH8 | CH9 | CH10 | PSL-3 |
|---|---|---|---|---|---|---|---|---|---|---|---|---|
| t1 | SG2 | SG1 | FL | FL | FL | FL | FL | FL | FL | FL | FL | FL |
| t2 | FL | SG2 | FL | SG1 | FL | FL | FL | FL | FL | FL | FL | FL |
| t3 | FL | FL | SG2 | FL | SG1 | FL | FL | FL | FL | FL | FL | FL |
| t4 | FL | FL | FL | SG2 | FL | SG1 | FL | FL | FL | FL | FL | FL |
| t5 | FL | FL | FL | FL | SG2 | FL | SG1 | FL | FL | FL | FL | FL |
| t6 | FL | FL | FL | FL | FL | SG2 | FL | SG1 | FL | FL | FL | FL |
| t7 | FL | FL | FL | FL | FL | FL | SG2 | FL | SG1 | FL | FL | FL |
| t8 | FL | FL | FL | FL | FL | FL | FL | SG2 | FL | SG1 | FL | FL |
| t9 | FL | FL | FL | FL | FL | FL | FL | FL | SG2 | FL | SG1 | FL |
| t10 | FL | FL | FL | FL | FL | FL | FL | FL | FL | SG2 | FL | SG1 |
| t11 | FL | FL | FL | FL | FL | FL | FL | FL | FL | FL | SG2 | SG1 |

ELECTRONIC DEVICE WITH INPUT SENSOR AND NON-OVERLAPPING CHARGING ELECTRODE

CROSS-REFERENCE TO RELATED APPLICATIONS

This U.S. patent application claims priority under 35 U.S.C. § 119 to Korean Patent Application No. 10-2023-0194846 filed on Dec. 28, 2023, in the Korean Intellectual Property Office, the disclosure of which is incorporated by reference in its entirety herein.

1. Technical Field

Embodiments of the present disclosure described herein are directed to an electronic device including an input sensor.

Multimedia electronic devices, such as televisions, mobile phones, tablet computers, notebook computers, car navigation units, game machines, and the like, include a display device for displaying an image.

The electronic devices may include a touch-based input system that enables a user to intuitively and conveniently input information or instructions, different from a general input system such as a button, a keyboard or a mouse. A sensor layer of the touch-based input system may sense a touch or pressure of an object (e.g., a finger or pen). For example, the pen may be used for sketching or drawing.

Interference may occur between a driving transistor of a display layer of the display device and a charging electrode of the display device used for inducing a magnetic field to detect the pen, which may make it difficult to detect the pen or result in artifacts on the display layer. Thus, there is a need for an electronic capable of reducing this interference.

SUMMARY

Embodiments of the present disclosure provide an electronic device for sensing inputs of different types that reduces interference between the driving transistor and the charging electrode.

According to an embodiment, an electronic device includes a base layer, a light emitting element, an input sensor, a driving transistor and a charging electrode. The light emitting element is disposed above the base layer. The input sensor is disposed above the light emitting element. The driving transistor is disposed above the base layer and located on a current path between a power line and the light emitting element. The charging electrode is disposed below the driving transistor and does not overlap the driving transistor a plan view and is configured to generate an induced magnetic field.

According to an embodiment, an electronic device includes a base layer, a first light emitting element, a second light emitting element, an input sensor, a driving transistor, a second driving transistor, a first line portion and a second line portion. The base layer includes a first pixel area and a second pixel area arranged adjacent the first pixel area. The first light emitting element is disposed above the base layer and corresponds to the first pixel area. The second light emitting element is disposed above the base layer and corresponds to the second pixel area. The input sensor is disposed above the first light emitting element and the second light emitting element. The first driving transistor is disposed above the base layer and located on a current path between a power line and the first light emitting element and overlaps the first pixel area. The second driving transistor is disposed above the base layer and located on a current path between the power line and the second light emitting element and overlaps the second pixel area. The first line portion and the second line portion are disposed below the first driving transistor and the second driving transistor, respectively, and do not overlap the first driving transistor and the second driving transistor a plan view.

According to an embodiment, an electronic device includes a base layer, a display layer, and a sensing layer. The base layer includes a charging electrode that induces a magnetic field when current passes through the charging electrode. The display layer is located on the base layer. The display layer includes a driving transistor located between a driving voltage and a light emitting element. The sensing layer is disposed on the display layer. The charging electrode is disposed within the base layer without overlapping the driving transistor in a plan view.

BRIEF DESCRIPTION OF THE FIGURES

The above and other objects and features of the present disclosure will become apparent by describing in detail embodiments thereof with reference to the accompanying drawings.

FIGS. 17C and 17D are tables showing signals provided to the sensor layer according to an embodiment of the present disclosure.

DETAILED DESCRIPTION

Figure 1A:
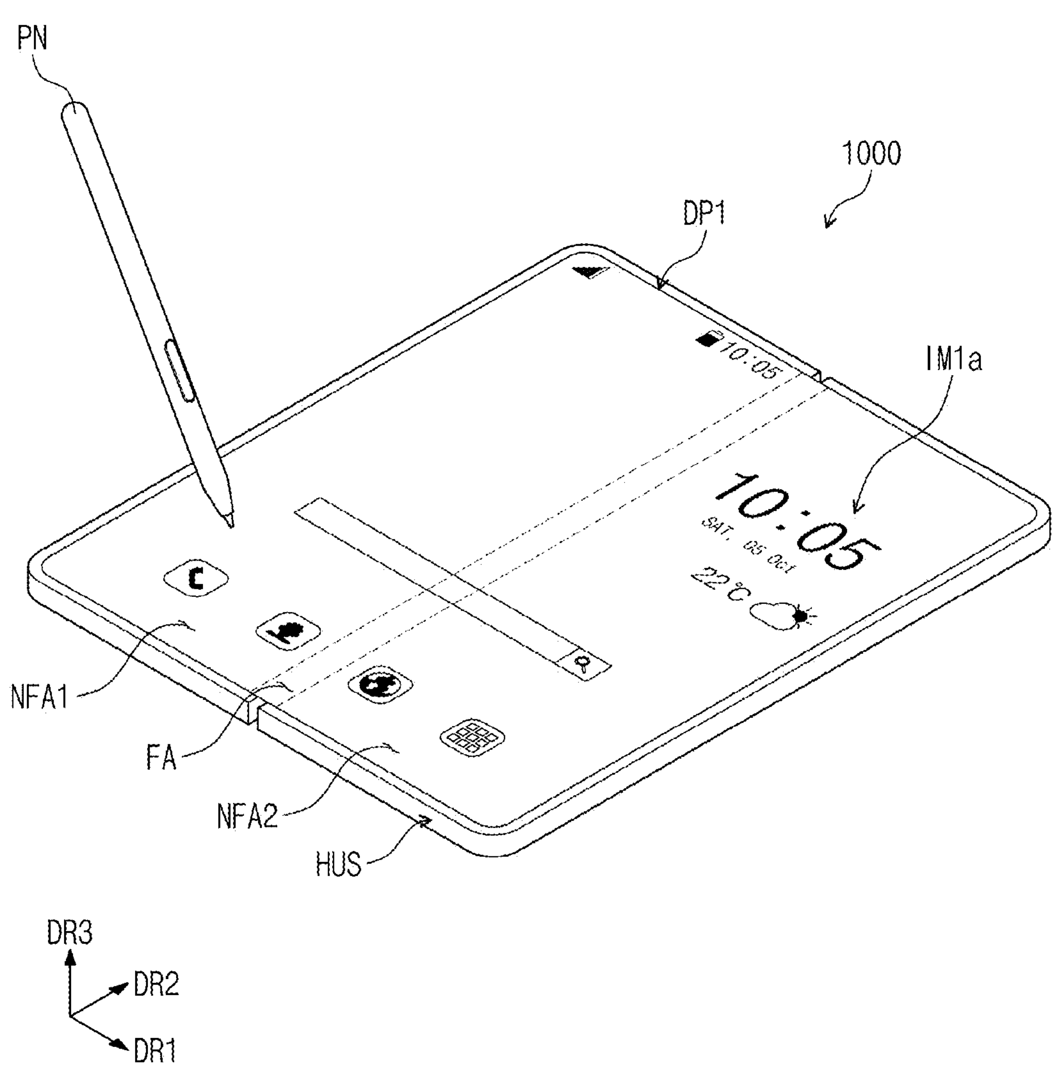
FIG. 1A is a perspective view of an electronic device according to an embodiment of the present disclosure.

In this specification, when it is mentioned that a component (or, an area, a layer, a part, etc.) is referred to as being "on", "connected to" or "coupled to" another component, this means that the component may be directly on, connected to, or coupled to the other component or a third component may be present therebetween.

Identical reference numerals refer to identical components. As used herein, the term "and/or" includes all of one or more combinations defined by related components. The terms of a singular form may include plural forms unless otherwise specified.

Hereinafter, embodiments of the present disclosure will be described with reference to the accompanying drawings.

Figure 1B:
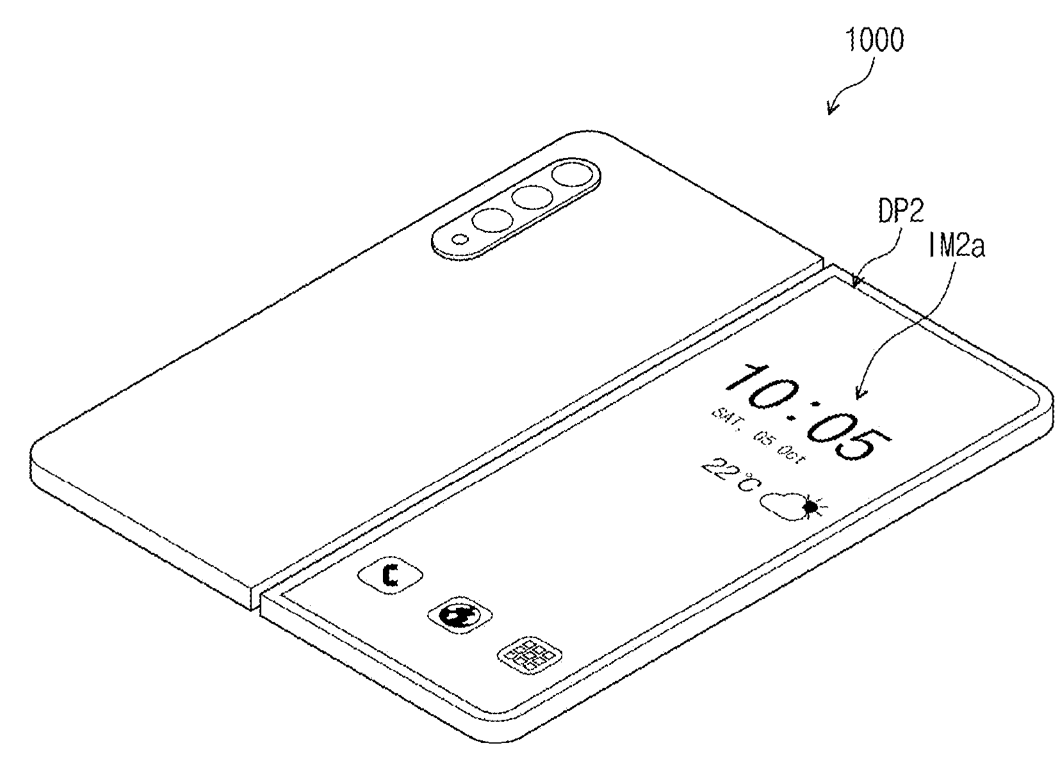
FIG. 1B is a rear perspective view of the electronic device according to an embodiment of the present disclosure.
Figure 1B:
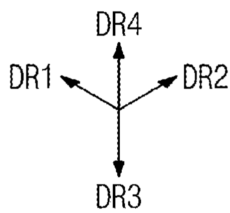
Figure 2:
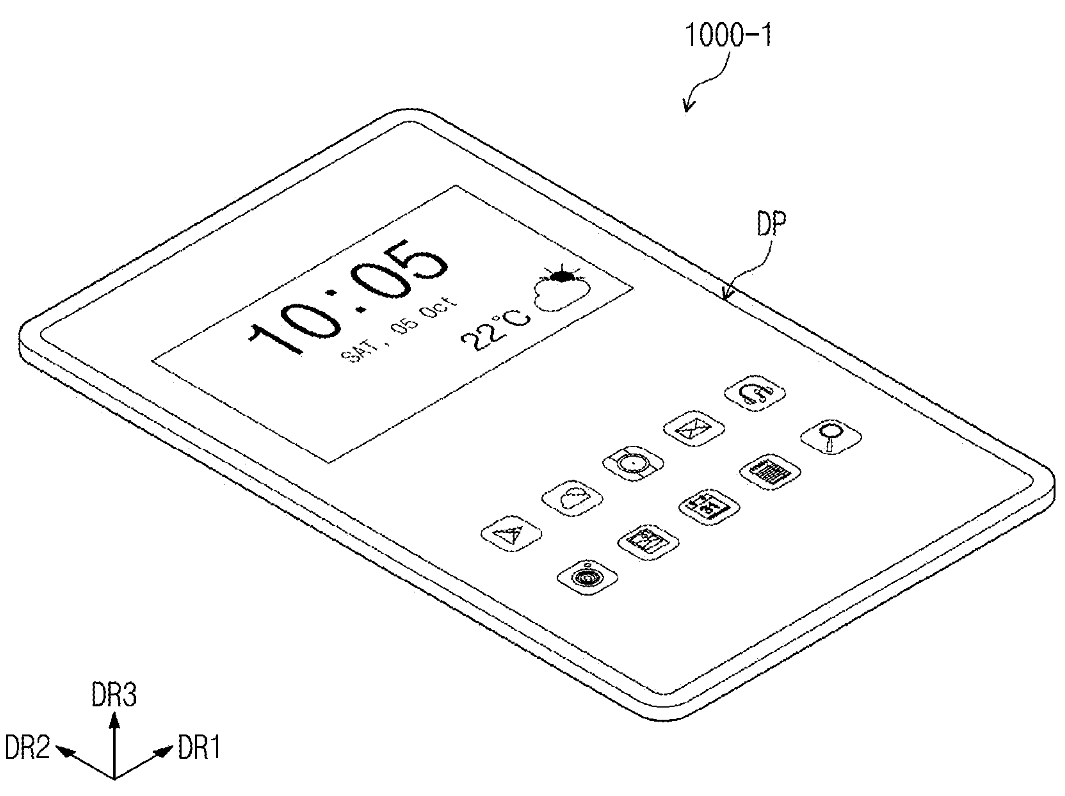
FIG. 2 is a perspective view of an electronic device according to an embodiment of the present disclosure.

FIG. 1A is a perspective view of an electronic device 1000 according to an embodiment of the present disclosure. FIG. 1B is a rear perspective view of the electronic device 1000 according to an embodiment of the present disclosure. FIG. 2 is a perspective view of an electronic device 1000-1 according to an embodiment of the present disclosure.

Referring to FIGS. 1A and 1B, in this embodiment, the electronic device 1000 may be a display device activated depending on an electrical signal. For example, the electronic device 1000 may display an image and may sense inputs applied from the outside. The external inputs may be user inputs. The external inputs may include various types of inputs such as an input by a part of a user's body, an input by an input means such as a pen.

The electronic device 1000 may include a first display panel DP1 and a second display panel DP2. The first display panel DP1 and the second display panel DP2 may be separate panels separated from each other. The first display panel DP1 may be referred to as a main display panel, and the second display panel DP2 may be referred to as an auxiliary display panel or an external display panel. The first display panel DP1 and the second display panel DP2 may be coupled to a housing HUS.

The second display panel DP2 may have a smaller area than the first display panel DP1. In an unfolded state of the electronic device 1000, the first display panel DP1 may have a plane substantially parallel to a first direction DR1 and a second direction DR2. The thickness direction of the electronic device 1000 may be parallel to a third direction DR3 that crosses the first direction DR1 and the second direction DR2. Accordingly, front surfaces (or, upper surfaces) and rear surfaces (or, lower surfaces) of members constituting the electronic device 1000 may be defined based on the third direction DR3.

The first display panel DP1 may include a folding area FA that is folded and unfolded and a plurality of non-folding areas NFA1 and NFA2 spaced apart from each other with the folding area FA therebetween. The second display panel DP2 may overlap one of the plurality of non-folding areas NFA1 and NFA2. For example, the second display panel DP2 may overlap the first non-folding area NFA1.

The display direction of a first image IM1*a* displayed on a portion of the first display panel DP1, for example, the first non-folding area NFA1 may be opposite to the display direction of a second image IM2*a* displayed on the second display panel DP2. For example, the first image IM1*a* may be displayed in the third direction DR3, and the second image IM2*a* may be displayed in a fourth direction DR4 (refer to FIG. 1B) that is opposite to the third direction DR3.

In an embodiment of the present disclosure, the folding area FA may be bent about a folding axis extending in a direction parallel to the long sides of the electronic device 1000, for example, in a direction parallel to the second direction DR2. The folding area FA may have a certain curvature and a certain radius of curvature in a folded state of the electronic device 1000. The electronic device 1000 may be folded in an in-folding manner such that the first non-folding area NFA1 and the second non-folding area NFA 2 face each other and the first display panel DP1 is not exposed to the outside. That is, the first display panel DP1 may be folded in an in-folding manner.

In an embodiment of the present disclosure, the first display panel DP1 may be folded in an out-folding manner so as to be exposed to the outside. In an embodiment of the present disclosure, the electronic device 1000 may be folded in an in-folding or out-folding manner in the unfolded state. However, the present disclosure is not limited thereto.

Although FIG. 1A illustrates an example where one folding area FA is defined in the electronic device 1000, the present disclosure is not limited thereto. For example, a plurality of folding axes and a plurality of folding areas corresponding thereto may be defined in the electronic device 1000, and the electronic device 1000 may be folded about the plurality of folding axes in an in-folding or out-folding manner in the unfolded state.

According to an embodiment of the present disclosure, at least one of the first display panel DP1 or the second display panel DP2 may sense an input by a pen PN even without a digitizer. Since the digitizer for sensing the pen PN is omitted, an increase in the thickness and weight of the electronic device 1000 and a decrease in the flexibility of the electronic device 1000 depending on the addition of the digitizer may not occur. Accordingly, not only the first display panel DP1 but also the second display panel DP2 may be designed to sense the pen PN.

Referring to FIG. 2, in this embodiment, the electronic device 1000-1 may be a mobile phone or a tablet computer and is not limited thereto. The electronic device 1000-1 may include a display panel DP.

In an embodiment of the present disclosure, the display panel DP may sense external inputs. According to an embodiment of the present disclosure, the display panel DP may sense an input by the pen PN even without a digitizer. When the digitizer for sensing the pen PN is omitted, an increase in the thickness and weight of the electronic device 1000-1 depending on the addition of the digitizer may not occur.

Although the foldable electronic device 1000 is illustrated in FIGS. 1A and 1B and the planar electronic device 1000-1 is illustrated in FIG. 2, the present disclosure that will be described below is not limited thereto. For example, the following descriptions may be applied to various electronic devices such as a rollable electronic device, a slidable electronic device, and a stretchable electronic device.

Figures 3, 4:
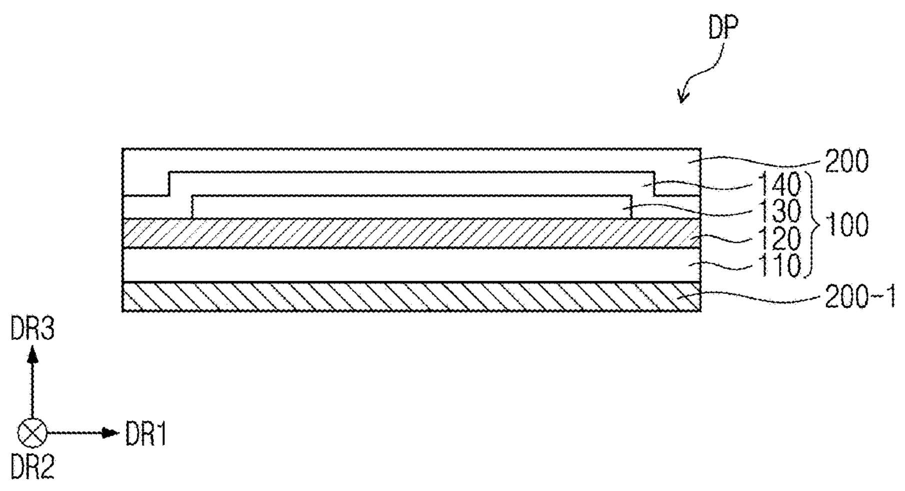
FIG. 3 is a schematic sectional view of a display panel according to an embodiment of the present disclosure.
FIG. 4 is a view illustrating an operation of an electronic device according to an embodiment of the present disclosure.

FIG. 3 is a schematic sectional view of the display panel DP according to an embodiment of the present disclosure. The display panel DP may be the first display panel DP1 or the second display panel DP2 of FIGS. 1A and 1B.

Referring to FIG. 3, the display panel DP may include a display layer 100, a sensor layer 200 (or, an input sensor), and a charging electrode layer 200-1. The sensor layer 200 may be disposed on the display layer 100, and the charging electrode layer 200-1 may be disposed under the display layer 100. In an embodiment of the present disclosure, the display layer 100 may be referred to as a display panel, and the sensor layer 200 may be referred to as an input sensor.

The display layer 100 may be a component that substantially generates an image. The display layer 100 may be an emissive display layer. For example, the display layer 100 may be an organic light emitting display layer, an inorganic light emitting display layer, an organic-inorganic light emitting display layer, a quantum-dot display layer, a micro-LED display layer, or a nano-LED display layer. The display layer 100 may include a base layer 110, a drive circuit layer 120, a light emitting element layer 130, and an encapsulation layer 140.

The base layer 110 may be a member that provides a base surface on which the drive circuit layer 120 is disposed. The base layer 110 may have a multi-layer structure or a single-layer structure. The base layer 110 may be a glass substrate, a metal substrate, a silicon substrate, or a polymer substrate, but is not limited thereto.

The drive circuit layer 120 may be disposed on the base layer 110. The drive circuit layer 120 may include an insulating layer, a semiconductor pattern, a conductive pattern, and a signal line. An insulating layer, a semiconductor layer, and a conductive layer may be formed on the base layer 110 by a process such as coating or deposition and may be selectively subjected to patterning by performing a photolithography process a plurality of times. In an embodiment of the present disclosure, the drive circuit layer 120 may be referred to as a drive element layer or a drive circuit layer.

The light emitting element layer 130 may be disposed on the drive circuit layer 120. The light emitting element layer 130 may include light emitting elements. For example, the light emitting element layer 130 may include an organic luminescent material, an inorganic luminescent material, an organic-inorganic luminescent material, a quantum dot, a quantum rod, a micro light-emitting-diode (LED), or a nano LED.

The encapsulation layer 140 may be disposed on the light emitting element layer 130. The encapsulation layer 140 may protect the light emitting element layer 130 from foreign matter such as moisture, oxygen, and dust particles.

The sensor layer 200 may sense an external input. The sensor layer 200 may be an integrated sensor continuously formed in a process of manufacturing the display layer 100. Alternatively, the sensor layer 200 may be an external sensor attached to the display layer 100. The sensor layer 200 may be referred to as a sensor, an input sensing layer, an input sensing panel, or an electronic device for sensing input coordinates.

In an embodiment of the present disclosure, one portion of the sensor layer 200 may be disposed on the display layer 100, and another portion of the sensor layer 200 may be disposed under the display layer 100. For example, a first conductive layer 202 and a sensing insulation layer 203 illustrated in FIG. 7 may be disposed under the display layer 100 rather than on the display layer 100. In this case, a second conductive layer 204 and a cover insulating layer 205 may be disposed on a base layer 201. The first conductive layer 202 may be disposed under the base layer 110, and the sensing insulation layer 203 may be disposed under the first conductive layer 202.

According to an embodiment of the present disclosure, the sensor layer 200 may sense both an input by a part of the user's body and an input by an input means that generates a magnetic field having a certain resonant frequency. In an embodiment of the present disclosure, the input means that generates the magnetic field having the certain resonant frequency is a pen, an input pen, a magnetic pen, a stylus pen, or an electromagnetic resonance pen.

According to an embodiment of the present disclosure, the charging electrode layer 200-1 generates an induced magnetic field to charge the input means that generates the magnetic field. As electric current flows through the charging electrode layer 200-1, the charging electrode layer 200-1 may generate the induced magnetic field.

FIG. 4 is a view illustrating an operation of the electronic device 1000 according to an embodiment of the present disclosure.

Referring to FIG. 4, the electronic device 1000 may include the display layer 100, the sensor layer 200, the charging electrode layer 200-1, a display driver 100C, a sensor driver 200C, a main driver 1000C, and a power circuit 1000P.

The sensor layer 200 may sense a first input 2000 or a second input 3000 applied from the outside. Each of the first input 2000 and the second input 3000 may be an input means capable of providing a change in the capacitance of the sensor layer 200 or an input means capable of causing an induced current in the sensor layer 200. For example, the first input 2000 may be an input means capable of providing charges. The second input 3000 may be an input by the pen PN or an input by a radio frequency identification (RFIC) tag. For example, the pen PN may be a passive pen or an active pen.

In an embodiment of the present disclosure, the pen PN may be a device that generates a magnetic field having a certain resonant frequency. The pen PN may be configured to transmit an output signal based on an electromagnetic resonance scheme. The pen PN may be an input pen, a magnetic pen, a stylus pen, or an electromagnetic resonance pen.

The pen PN may include an RLC resonance circuit, and the RLC resonance circuit may include an inductor L and a capacitor C. In an embodiment of the present disclosure, the RLC resonance circuit may be a variable resonance circuit that varies the resonant frequency. In this case, the inductor L may be a variable inductor, and/or the capacitor C may be a variable capacitor. However, the present disclosure is not limited thereto.

The inductor L may generate a current by a magnetic field formed in the charging electrode layer 200-1. However, the present disclosure is not limited thereto. For example, when the pen PN operates as an active type, the pen PN may generate a current even though a magnetic field is not provided to the pen PN from the outside. The generated current is transferred to the capacitor C. The capacitor C charges the current input from the inductor L and discharges the charged current to the inductor L. Thereafter, the inductor L may emit a magnetic field having a resonant frequency. An induced current may flow in the sensor layer 200 by the magnetic field emitted from the pen PN. The induced current may be transferred to the sensor driver 200C as a reception signal (or, a sensing signal). In addition, in an embodiment of the present disclosure, a magnetic field may be generated in the sensor layer 200.

The main driver 1000C (e.g., a driver circuit) may control overall operation of the electronic device 1000. For example, the main driver 1000C may control operations of the display driver 100C and the sensor driver 200C. The main driver 1000C may include at least one microprocessor and may further include a graphic controller. The main driver 1000C may be referred to as an application processor, a central processing unit, or a main processor.

The display driver 100C (e.g., a driver circuit) may drive the display layer 100. The display driver 100C may receive image data and a control signal from the main driver 1000C. The control signal may include various signals. For example, the control signal may include at least one of an input vertical synchronization signal, an input horizontal synchronization signal, a main clock signal, and a data enable signal.

The sensor driver 200C (e.g., a driver circuit) may drive the sensor layer 200 and the charging electrode layer 200-1. The sensor driver 200C may receive a control signal from the main driver 1000C. The control signal may include a clock signal of the sensor driver 200C. In addition, the control signal may further include a mode determination signal for determining a driving mode of the sensor driver 200C and the sensor layer 200.

The sensor driver 200C may be implemented with an integrated circuit (IC) and may be electrically connected with the sensor layer 200. For example, the sensor driver 200C may be directly mounted on a certain area of the display panel or may be mounted on a separate printed circuit board using a chip on film (COF) method and may be electrically connected with the sensor layer 200 and the charging electrode layer 200-1.

The sensor driver 200C and the sensor layer 200 may selectively operate in a first mode or a second mode. For example, the first mode may be a mode for sensing a touch input, for example, the first input 2000. The second mode may be a mode for sensing an input by the pen PN, for example, the second input 3000. The first mode may be referred to as a touch sensing mode, and the second mode may be referred to as a pen sensing mode. The sensor driver 200C may drive the charging electrode layer 200-1 in the second mode.

Switching between the first mode and the second mode may be performed in various ways. For example, the sensor driver 200C and the sensor layer 200 may be driven in the first mode and the second mode in a time-division manner and may sense the first input 2000 and the second input 3000. The charging electrode layer 200-1 may operate in synchronization with the sensor layer 200. The charging electrode layer 200-1 may stop operating in the first mode and may operate during a certain period in the second mode.

Alternatively, the switching between the first mode and the second mode may be performed by a user's selection or the user's specific action, or by activating or deactivating a specific application, one of the first mode and the second mode may be activated or deactivated or the driving mode may be switched from one mode to the other mode. In another case, while the sensor driver 200C and the sensor layer 200 alternately operate in the first mode and the second mode, when the first input 2000 is sensed, the sensor driver 200C and the sensor layer 200 may remain in the first mode, and when the second input 3000 is sensed, the sensor driver 200C and the sensor layer 200 may remain in the second mode.

The sensor driver 200C may calculate coordinate information of an input based on a signal received from the sensor layer 200 and may provide a coordinate signal having the coordinate information to the main driver 1000C. The main driver 1000C executes an operation corresponding to the user input, based on the coordinate signal. For example, the main driver 1000C may operate the display driver 100C such that a new application image is displayed on the display layer 100.

The power circuit 1000P may include a power management integrated circuit (PMIC). The power circuit 1000P may generate a plurality of drive voltages for driving the display layer 100, the sensor layer 200, the charging electrode layer 200-1, the display driver 100C, and the sensor driver 200C. For example, the plurality of drive voltages may include a gate high-voltage, a gate low-voltage, a first drive voltage (e.g., an ELVSS voltage), a second drive voltage (e.g., an ELVDD voltage), an initialization voltage, and the like, but are not limited to these examples.

Figure 5:
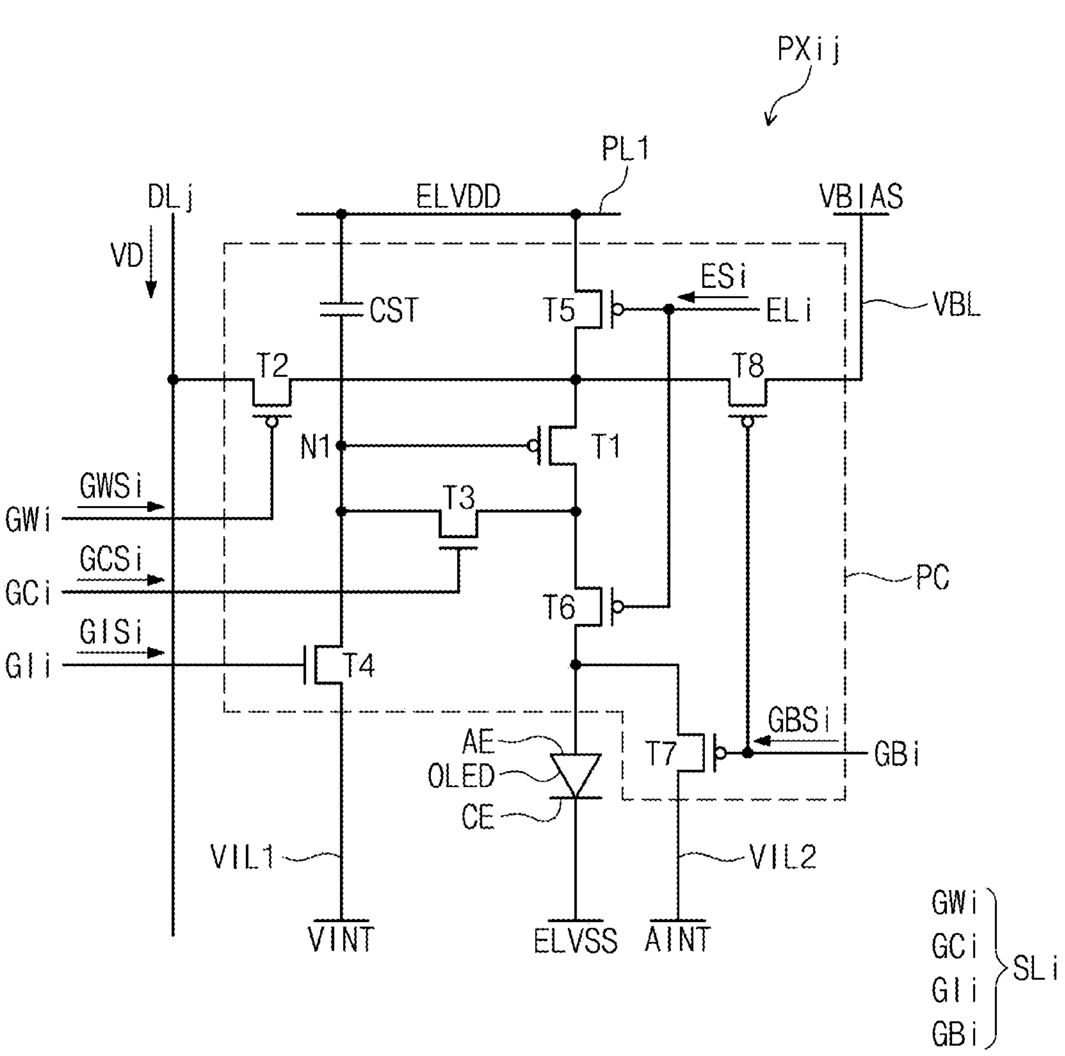
FIG. 5 is an equivalent circuit diagram of a pixel according to an embodiment of the present disclosure.
Figure 6:
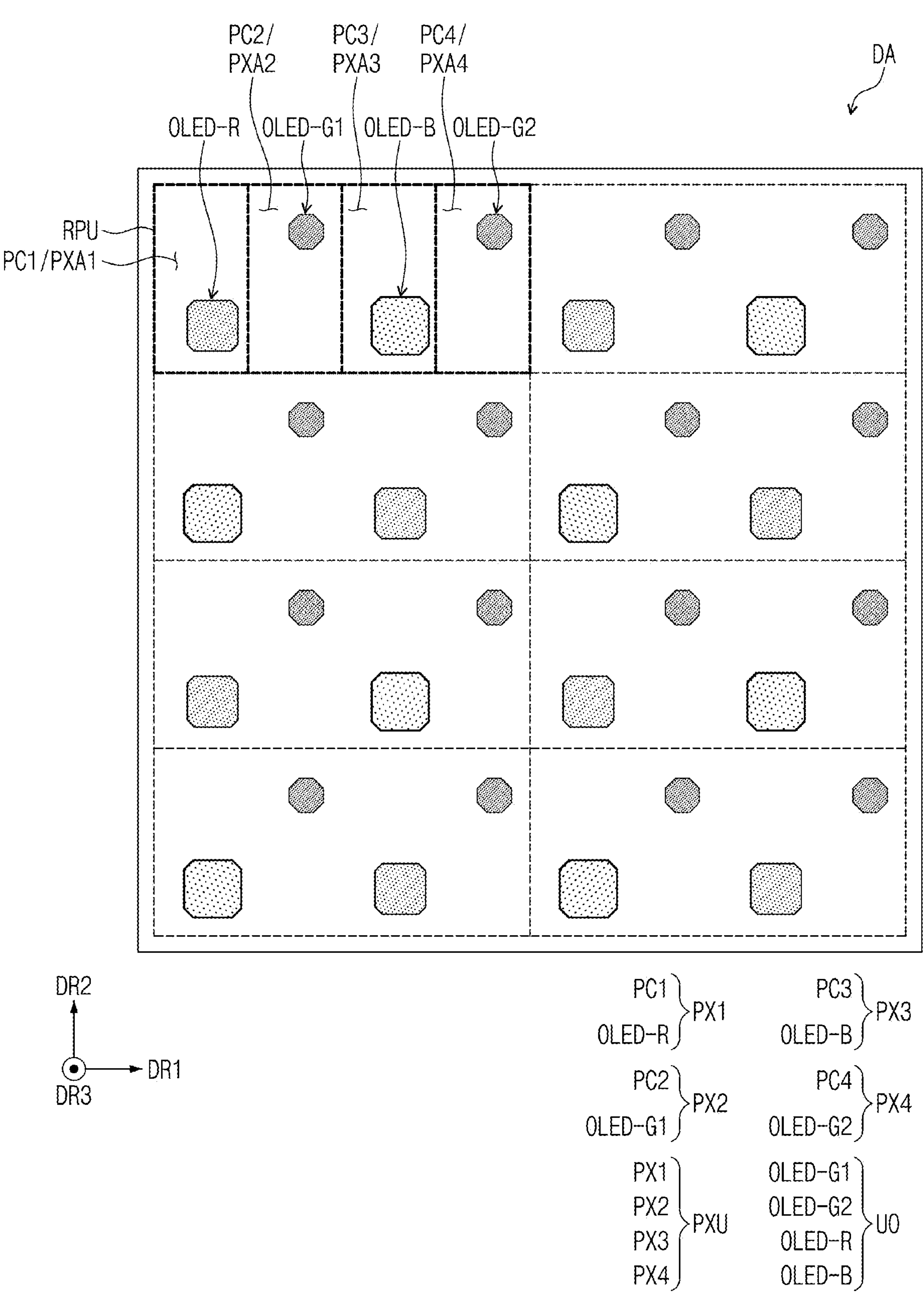
FIG. 6 is a plan view of a display area according to an embodiment of the present disclosure.

FIG. 5 is an equivalent circuit diagram of a pixel PXij according to an embodiment of the present disclosure. FIG. 6 is a plan view of a display area DA according to an embodiment of the present disclosure.

In FIG. 5, the pixel PXij connected to $i^{th}$ scan lines SLi, an $i^{th}$ light emission line ELi, and a $j^{th}$ data line DLj is illustrated as an example. Here, "i" and "j" are natural numbers. The $i^{th}$ scan lines SLi may include an $i^{th}$ initialization scan line GIi, an $i^{th}$ compensation scan line GCi, an $i^{th}$ bias scan line GBi, and an $i^{th}$ write scan line GWi.

Referring to FIG. 5, the pixel PXij may include a pixel drive circuit PC and a light emitting element OLED electrically connected to the pixel drive circuit PC. The light emitting element OLED may be turned on or off under the control of the pixel drive circuit PC.

The pixel drive circuit PC may include a plurality of transistors T1 to T8 and a capacitor CST. The transistors T1 to T8 and the capacitor CST may control the amount of current flowing through the light emitting element OLED. The light emitting element OLED may generate light having a certain luminance depending on the amount of current provided thereto.

The $i^{th}$ write scan line GWi may receive an $i^{th}$ write scan signal GWSi, and the $i^{th}$ compensation scan line GCi may receive an $i^{th}$ compensation scan signal GCSi. The $i^{th}$ initialization scan line GIi may receive an $i^{th}$ initialization scan signal GISi, and the $i^{th}$ bias scan line GBi may receive an $i^{th}$ bias scan signal GBSi. An $i^{th}$ reset scan line GRi may receive an $i^{th}$ reset scan signal GRSi. The $i^{th}$ light emission line ELi may receive an $i^{th}$ light emission signal ELSi.

A first initialization line VIL1 may receive a first initialization voltage VINT, and a second initialization line VIL2 may receive a second initialization voltage AINT. A bias line VBL may receive a bias voltage VBIAS. A first power line PL1 may receive a first drive voltage ELVDD, and a second power line PL2 may receive a second drive voltage ELVSS. The light emitting element OLED may be connected to the second power line PL2. A reset line VRL may receive a reset voltage VRST.

Each of the transistors T1 to T8 may include a source (or, a source terminal), a drain (or, a drain terminal), and a gate (or, a gate terminal). Hereinafter, in FIG. 5, for convenience, one of the source and the drain is referred to as a first electrode, and the other one of the source and the drain is referred to as a second electrode. In addition, the gate may be referred to as a gate electrode or a control electrode.

The transistors T1 to T8 may include the first to eighth transistors T1 to T8. The first, second, and fifth to eighth transistors T1, T2, and T5 to T8 may be N-channel metal-oxide-semiconductor (PMOS) transistors. The third and fourth transistors T3 and T4 may be P-channel metal-oxide-semiconductor (NMOS) transistors.

The first transistor T1 may be referred to as a driving transistor, and the second transistor T2 may be referred to as a switching transistor. The third transistor T3 may be referred to as a compensation transistor. The fourth transistor T4 and the seventh transistor T7 may be referred to as initialization transistors. The fifth transistor T5 and the sixth transistor T6 may be referred to as light emission control transistors. The eighth transistor T8 may be referred to as a bias transistor.

The light emitting element OLED may include an organic light emitting diode. The light emitting element OLED may include a first electrode, a second electrode, and an emissive layer disposed between the first electrode and the second electrode. In this embodiment, for convenience of description, the first electrode is referred to as an anode AE, and the second electrode is referred to as a cathode CE. The anode AE may be electrically connected to the first power line PL1 through the sixth, first, and fifth transistors T6, T1, and T5. The cathode CE may be electrically connected to the second power line PL2.

The first transistor T1 is located on a current path between the first power line PL1 and the light emitting element OLED. The first transistor T1 may be disposed between the fifth transistor T5 and the sixth transistor T6 and may be connected to the fifth transistor T5 and the sixth transistor T6. The first transistor T1 may be connected to the first power line PL1 through the fifth transistor T5 and may be connected to the anode AE through the sixth transistor T6.

The first transistor T1 may include the first electrode connected to the first power line PL1 through the fifth transistor T5, the second electrode connected to the anode AE through the sixth transistor T6, and the gate electrode connected to a first node N1.

The first electrode of the first transistor T1 may be connected to the fifth transistor T5, and the second electrode of the first transistor T1 may be connected to the sixth transistor T6. The first transistor T1 may control the amount of current flowing through the light emitting element OLED depending on the voltage of the first node N1 applied to the gate electrode of the first transistor T1.

The second transistor T2 may be disposed between the first transistor T1 and the $j^{th}$ data line DLj and may be connected to the first transistor T1 and the $j^{th}$ data line DLj. The second transistor T2 may include the first electrode connected to the $j^{th}$ data line DLj, the second electrode connected to the first electrode of the first transistor T1, and the gate electrode connected to the $i^{th}$ write scan line GWi.

The second transistor T2 may be turned on by the $i^{th}$ write scan signal GWSi applied through the $i^{th}$ write scan line GWi and may electrically connect the $j^{th}$ data line DLj and the first electrode of the first transistor T1. The second transistor T2 may perform a switching operation of providing a data voltage VD applied through the $j^{th}$ data line DLj to the first electrode of the first transistor T1.

The third transistor T3 may be connected to the second electrode of the first transistor T1 and the first node N1. The third transistor T3 may include the first electrode connected to the second electrode of the first transistor T1, the second electrode connected to the first node N1, and the gate electrode connected to the $i^{th}$ compensation scan line GCi.

The third transistor T3 may be turned on by the $i^{th}$ compensation scan signal GCSi applied through the $i^{th}$ compensation scan line GCi and may electrically connect the second electrode of the first transistor T1 and the gate electrode of the first transistor T1. When the third transistor T3 is turned on, the first transistor T1 and the third transistor T3 may be connected in a diode form.

The fourth transistor T4 may be connected to the first node N1. The fourth transistor T4 may include the first electrode connected to the first node N1, the second electrode connected to the first initialization line VIL1, and the gate electrode connected to the $i^{th}$ initialization scan line GIi. The fourth transistor T4 may be turned on by the $i^{th}$ initialization scan signal GISi applied through the $i^{th}$ initialization scan line GIi and may provide the first initialization voltage VINT applied through the first initialization line VIL1 to the first node N1.

The fifth transistor T5 may include the first electrode connected to the first power line PL1, the second electrode connected to the first electrode of the first transistor T1, and the gate electrode connected to the $i^{th}$ light emission line ELi. The sixth transistor T6 may include the first electrode connected to the second electrode of the first transistor T1, the second electrode connected to the anode AE, and the gate electrode connected to the $i^{th}$ light emission line ELi.

The fifth transistor T5 and the sixth transistor T6 may be turned on by the $i^{th}$ light emission signal ESi applied through the $i^{th}$ light emission line ELi. The first voltage ELVDD may be provided to the light emitting element OLED by the turned-on fifth transistor T5 and the turned-on six transistor T6, and a drive current may flow through the light emitting element OLED. Accordingly, the light emitting element OLED may emit light.

The seventh transistor T7 may include the first electrode connected to the anode AE, the second electrode connected to the second initialization line VIL2, and the gate electrode connected to the $i^{th}$ bias scan line GBi. The seventh transistor T7 may be turned on by the $i^{th}$ bias scan signal GBSi applied through the $i^{th}$ bias scan line GBi and may provide the second initialization voltage AINT received through the second initialization line VIL2 to the anode AE of the light emitting element OLED.

In an embodiment of the present disclosure, the seventh transistor T7 is omitted. In an embodiment of the present disclosure, the second initialization voltage AINT has a level different from that of the first initialization voltage VINT. However, in other embodiments, the second initialization voltage AINT has the same level as the first initialization voltage VINT.

The seventh transistor T7 may increase the ability of the pixel PXij to express black. When the seventh transistor T7 is turned on, a parasitic capacitor of the light emitting element OLED may be discharged. Accordingly, when black luminance is implemented, the light emitting element OLED does not emit light due to the leakage current of the first transistor T1, and thus the ability to express black may be increased.

The capacitor CST may include a first electrode connected to the first power line PL1 and a second electrode connected to the first node N1. When the fifth transistor T5 and the sixth transistor T6 are turned on, the amount of current flowing through the first transistor T1 may be determined depending on the voltage stored in the capacitor CST.

The eighth transistor T8 may include the first electrode connected to the bias line VBL, the second electrode connected to the first electrode of the first transistor T1, and the gate electrode connected to the $i^{th}$ bias scan line GBi. In an embodiment of the present disclosure, the eighth transistor T8 is omitted.

The eighth transistor T8 may be turned on by the $i^{th}$ bias scan signal GBSi and may provide the bias voltage VBIAS to the first electrode of the first transistor T1. As the bias voltage VBIAS is applied to the first transistor T1, the movement of the hysteresis curve of the first transistor T1 may be suppressed.

The display area DA of FIG. 6 may be an area of the first display panel DP1 of FIG. 1A on which the first image IM1*a* is displayed. The first display panel DP1 of FIG. 1A, when viewed from above the plane, may further include a non-display area where the first image IM1*a* is not displayed.

In FIG. 6, unit areas RPU repeatedly arranged in the display area DA are illustrated. One or more pixels PX1, PX2, PX3, and PX4 are disposed to correspond to each of the unit areas RPU. A combination of the pixels PX1, PX2, PX3, and PX4 corresponding to each of the unit areas RPU may be defined as a unit pixel PXU.

The unit areas RPU may be disposed in the entire display area DA, but are not limited thereto. Unit areas of a different type from the above-described unit areas RPU may be disposed in a partial region of the display area DA.

In this embodiment, the unit pixel PXU includes the first to fourth pixels PX1, PX2, PX3, and PX4. However, the number of pixels in the unit pixel PXU may be changed. The first pixel PX1 may include a first light emitting element OLED-R and a first drive circuit PC1 electrically connected thereto. The second pixel PX2 may include a second-first light emitting element OLED-G1 and a second drive circuit PC2 electrically connected thereto. The third pixel PX3 may include a third light emitting element OLED-B and a third drive circuit PC3 electrically connected thereto. The fourth pixel PX4 may include a second-second light emitting element OLED-G2 and a fourth drive circuit PC4 electrically connected thereto.

In an embodiment of the present disclosure, the unit areas RPU may be distinguished based on the arrangement of the first to fourth drive circuits PC1, PC2, PC3, and PC4. In the unit area RPU, the first to fourth drive circuits PC1, PC2, PC3, and PC4 may occupy the same area. The unit area RPU may include first to fourth pixel areas PXA1, PXA2, PXA3, and PXA4 corresponding to the first to fourth drive circuits PC1, PC2, PC3, and PC4.

The first, second-first, third, and second-second light emitting elements OLED-R, OLED-G1, OLED-B, and OLED-G2 of the unit pixel PXU may be disposed to overlap each of the unit areas RPU. Hereinafter, the light emitting elements OLED-R, OLED-G1, OLED-B, and OLED-G2 corresponding to the unit pixel PXU are defined as a unit light emitting element UO. In the unit areas RPU, the arrangement of the unit light emitting element UO may be the same.

The first light emitting element OLED-R generates light of a first color, for example, red light. The second-first light emitting element OLED-G1 and the second-second light emitting element OLED-G2 generate light of a second color, for example, green light. The third light emitting element OLED-B generates light of a third color, for example, blue light. The third light emitting element OLED-B may have the largest light emitting area, and the second-first light emitting element OLED-G1 and the second-second light emitting element OLED-G2 may have the smallest light emitting area.

In this embodiment, the first light emitting element OLED-R and the third light emitting element OLED-B may be disposed on the same line or in a same row and may be spaced apart from each other in the first direction DR1. The second-first light emitting element OLED-G1 and the second-second light emitting element OLED-G2 may be disposed on the same line or in a same row, but may be disposed on a line different from the line on which the first light emitting element OLED-R and the third light emitting element OLED-B are disposed.

Figure 7:
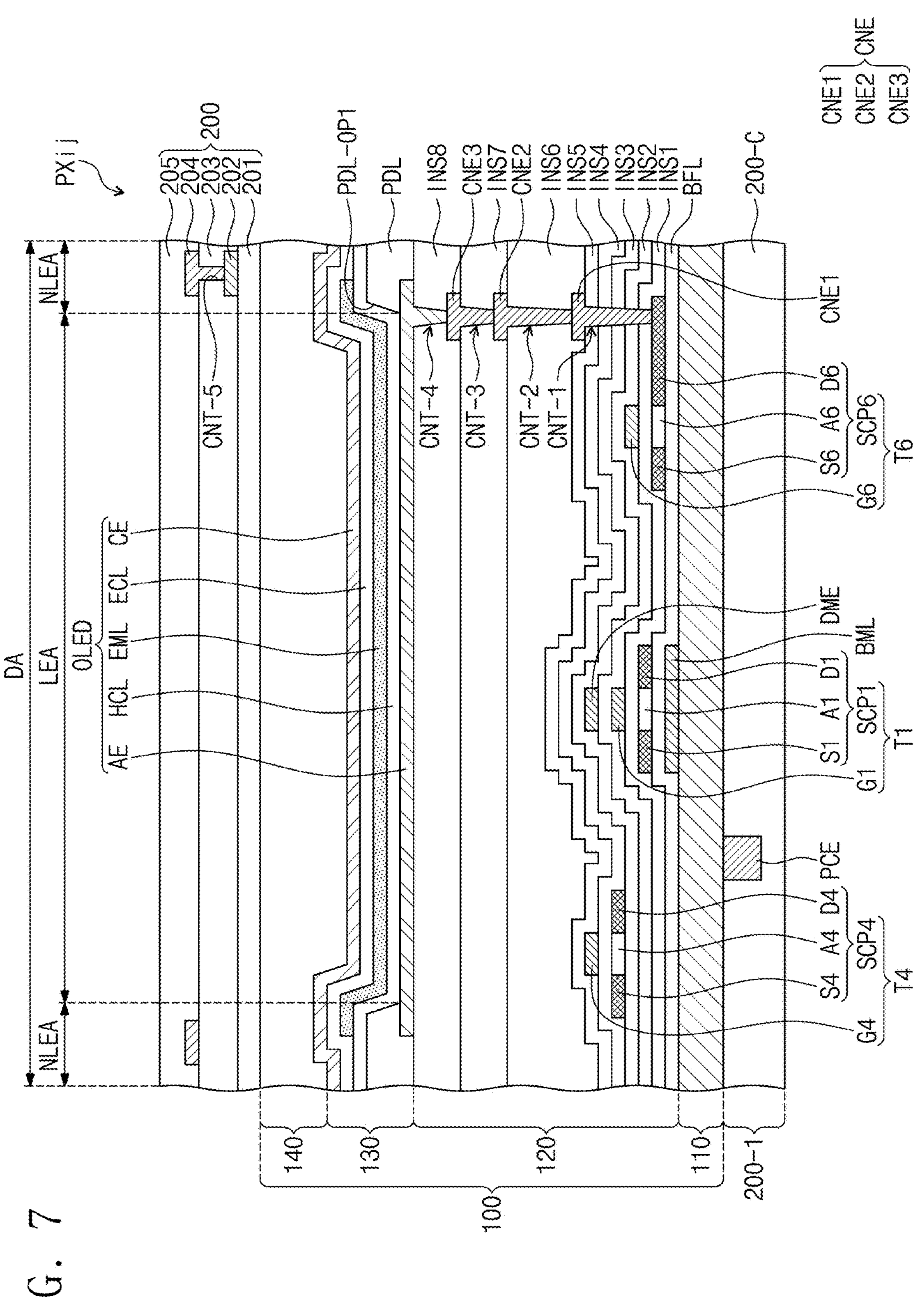
FIG. 7 is a sectional view of the display panel according to an embodiment of the present disclosure.

FIG. 7 is a sectional view of the display panel DP according to an embodiment of the present disclosure.

The display panel DP may be the first display panel DP1 or the second display panel DP2 of FIGS. 1A and 1B. FIG. 7 is a sectional view illustrating the light emitting element OLED, the first transistor T1, the fourth transistor T4, and the sixth transistor T6 of the pixel PXij illustrated in FIG. 5.

Referring to FIG. 7, a shielding electrode BML may be disposed on the base layer 110. In an embodiment, the shielding electrode BML overlaps the first transistor T1. The shielding electrode BML may include metal and may receive a constant voltage. When the constant voltage is applied to the shielding electrode BML, the threshold voltage Vth of the first transistor T1 disposed over the shielding electrode BML may remain unchanged. In an embodiment, the shielding electrode BML receives a ground voltage, or the shielding electrode BML is a floating electrode that does not receive a certain voltage.

A buffer layer BFL may be disposed on the base layer 110. The buffer layer BFL may include an inorganic layer. The buffer layer BFL may cover the shielding electrode BML. A metal layer formed on the base layer 110, such as the shielding electrode BML, may be defined as a shielding layer.

A first semiconductor layer is disposed on the buffer layer BFL. The first semiconductor layer may include a semiconductor layer SCP1 (hereinafter, described as the first semiconductor pattern area) of the first transistor T1 and a semiconductor layer SCP6 (hereinafter, described as the sixth semiconductor pattern area) of the sixth transistor T6. The first and sixth semiconductor pattern areas SCP1 and SCP6 may include poly-silicon. However, in an alternate embodiment, the first and sixth semiconductor pattern areas SCP1 and SCP6 may include amorphous silicon.

The first and sixth semiconductor pattern areas SCP1 and SCP6 may be formed through the same process, and partial regions of the first and sixth semiconductor pattern areas SCP1 and SCP6 may be doped with an N-type dopant or a P-type dopant. Each of the first and sixth semiconductor pattern areas SCP1 and SCP6 may include highly-doped areas and a lightly-doped area. The highly-doped areas have a higher conductivity than the lightly-doped area. The highly-doped areas may substantially correspond to the source and the drain of each of the first and sixth transistors T1 and T6. The lightly-doped area may substantially correspond to the active (or, channel) area of each of the first and sixth transistors T1 and T6.

The highly-doped areas of the first semiconductor pattern area SCP1 may include a first source area S1 and a first drain area D1. The lightly-doped area of the first semiconductor pattern area SCP1 is defined as a first channel area A1 and disposed between the first source area S1 and the first drain area D1. Similarly to the first semiconductor pattern area SCP1, the sixth semiconductor pattern area SCP6 may include a sixth source area S6, a sixth channel area A6, and a sixth drain area D6.

Although the first semiconductor pattern area SCP1 and the sixth semiconductor pattern area SCP6 are spaced apart from each other on the section of FIG. 7, the first semiconductor pattern area SCP1 and the sixth semiconductor pattern area SCP6 may have a one-body shape when viewed from above the plane. In other words, the first semiconductor pattern area SCP1 and the sixth semiconductor pattern area SCP6 may be different portions or areas of one semiconductor pattern.

A first insulating layer INS1 may be disposed on the buffer layer BFL to cover the first and sixth semiconductor pattern areas SCP1 and SCP6. The gate electrodes of the first and sixth transistors T1 and T6 are disposed on the first insulating layer INS1. The gate electrodes of the first and sixth transistors T1 and T6 may be formed through the same process. Hereinafter, the gate electrode of the first transistor T1 is referred to as the first gate electrode G1, and the gate electrode of the sixth transistor T6 is referred to as the sixth gate electrode G6. A metal layer formed on the first insulating layer INS1, such as the first gate electrode G1, may be referred to as a first gate layer. The first gate layer may further include a plurality of patterns as well as the first gate electrode G1 and the sixth gate electrode G6.

A second insulating layer INS2 may be disposed on the first insulating layer INS1 to cover the first and sixth gate electrodes G1 and G6. A dummy electrode DME may be disposed on the second insulating layer INS2. The dummy electrode DME may be disposed over the first gate electrode G1 and may overlap the first gate electrode G1 when viewed from above the plane. The dummy electrode DME may form the capacitor CST of FIG. 5 together with the first gate electrode G1. In other words, the first gate electrode G1 corresponds to one electrode of the capacitor CST, and the dummy electrode DME corresponds to the other electrode of the capacitor CST. A metal layer formed on the second insulating layer INS2, such as the dummy electrode DME, may be defined as a second gate layer. The second gate layer may further include a plurality of patterns as well as the dummy electrode DME.

A third insulating layer INS3 may be disposed on the second insulating layer INS2 to cover the dummy electrode DME. A second semiconductor layer is disposed on the third insulating layer INS3. The second semiconductor layer may include a semiconductor layer SCP4 (hereinafter, described as the fourth semiconductor pattern area) of the fourth transistor T4. The fourth semiconductor pattern area SCP4 may include an oxide semiconductor including metal oxide. The oxide semiconductor may include a crystalline or amorphous oxide semiconductor.

The fourth semiconductor pattern area SCP4 may include a plurality of areas distinguished from one another depending on whether metal oxide is reduced or not. Areas where metal oxide is reduced (hereinafter, referred to as the reduced areas) have a higher conductivity than an area where metal oxide is not reduced (hereinafter, referred to as the non-reduced area). The reduced areas may substantially correspond to the source and the drain of the fourth transistor T4. The non-reduced area may substantially correspond to the active (or, channel) area of the fourth transistor T4.

The reduced areas of the fourth semiconductor pattern area SCP4 may include a fourth source area S4 and a fourth drain area D4. A fourth channel area A4 may be disposed between the fourth source area S4 and the fourth drain area D4.

A fourth insulating layer INS4 may be disposed on the third insulating layer INS3 to cover the fourth semiconductor pattern area SCP4. A gate electrode G4 (hereinafter, referred to as the fourth gate electrode) of the fourth transistor T4 may be disposed on the fourth insulating layer INS4. A metal layer formed on the fourth insulating layer INS4, such as the fourth gate electrode G4, may be referred to as a third gate layer. The third gate layer may further include a plurality of patterns as well as the fourth gate electrode G4.

A fifth insulating layer INS5 may be disposed on the fourth insulating layer INS4 to cover the fourth gate electrode G4. The buffer layer BFL and the first to fifth insulating layers INS1 to INS5 may include inorganic layers.

A connecting electrode CNE may be disposed between the sixth transistor T6 and the light emitting element OLED. The connecting electrode CNE may electrically connect the sixth transistor T6 and the light emitting element OLED. The connecting electrode CNE may include a first connecting electrode CNE1, a second connecting electrode CNE2 disposed over the first connecting electrode CNE1, and a third connecting electrode CNE3 disposed over the second connecting electrode CNE2.

The first connecting electrode CNE1 may be disposed on the fifth insulating layer INS5 and may be connected to the sixth drain area D6 through a first contact hole CNT-1 defined in the first to fifth insulating layers INS1 to INS5. A metal layer formed on the fifth insulating layer INS5, such as the first connecting electrode CNE1, may be referred to as a first source/drain layer. The first source/drain layer may further include a plurality of patterns as well as the first connecting electrode CNE1.

A sixth insulating layer INS6 may be disposed on the fifth insulating layer INS5 to cover the first connecting electrode CNE1. The second connecting electrode CNE2 may be disposed on the sixth insulating layer INS6. The second connecting electrode CNE2 may be connected to the first connecting electrode CNE1 through a second contact hole CNT-2 defined in the sixth insulating layer INS6. A metal layer formed on the sixth insulating layer INS6, such as the second connecting electrode CNE2, may be referred to as a second source/drain layer. The second source/drain layer may further include a plurality of patterns as well as the second connecting electrode CNE2.

A seventh insulating layer INS7 may be disposed on the sixth insulating layer INS6 to cover the second connecting electrode CNE2. The third connecting electrode CNE3 may be disposed on the seventh insulating layer INS7. The third connecting electrode CNE3 may be connected to the second connecting electrode CNE2 through a third contact hole CNT-3 defined in the seventh insulating layer INS7. A metal layer formed on the seventh insulating layer INS7, such as the third connecting electrode CNE3, may be referred to as a third source/drain layer. The third source/drain layer may further include a plurality of patterns as well as the third connecting electrode CNE3.

An eighth insulating layer INS8 may be disposed on the seventh insulating layer INS7 to cover the third connecting electrode CNE3. The light emitting element OLED is disposed on the eighth insulating layer INS8. The sixth to eighth insulating layers INS6 to INS8 may include an inorganic layer or an organic layer. In this embodiment, each of the sixth to eighth insulating layers INS6 to INS8 may include an organic layer.

The light emitting element OLED may include a first electrode AE, a second electrode CE, a hole control layer HCL, an electron control layer ECL, and an emissive layer EML. The first electrode AE may be the anode AE illustrated in FIG. 5, and the second electrode CE may be the cathode CE illustrated in FIG. 5. The second electrode CE may be disposed over the first electrode AE, the hole control layer HCL and the electron control layer ECL may be disposed between the first electrode AE and the second electrode CE, and the emissive layer EML may be disposed between the hole control layer HCL and the electron control layer ECL. The first electrode AE may be disposed on the eighth insulating layer INS8. The first electrode AE may be electrically connected to the third connecting electrode CNE3 through a fourth contact hole CNT-4 defined in the eighth insulating layer INS8.

A pixel defining layer PDL that exposes a certain portion of the first electrode AE may be disposed on the first electrode AE and the eighth insulating layer INS8. An opening PDL-OP1 for exposing the certain portion of the first electrode AE may be defined in the pixel defining layer PDL. The opening PDL-OP1 corresponds to an emissive area LEA. The display area DA may include the emissive area LEA corresponding to the opening PDL-OP1 and a non-emissive area NLEA adjacent to the emissive area LEA.

The hole control layer HCL may be disposed on the first electrode AE and the pixel defining layer PDL. The hole control layer HCL may be commonly disposed in the emissive area LEA and the non-emissive area NLEA. The hole control layer HCL may include a hole transport layer and a hole injection layer.

The emissive layer EML may be disposed on the hole control layer HCL. The emissive layer EML may be disposed in an area corresponding to the opening PDL-OP1. The emissive layer EML may include an organic material and/or an inorganic material. The emissive layer EML may generate one of red light, green light, and blue light.

The electron control layer ECL may be disposed on the emissive layer EML and the hole control layer HCL. The electron control layer ECL may be commonly disposed in the emissive area LEA and the non-emissive area NLEA. The electron control layer ECL may include an electron transport layer and an electron injection layer.

The second electrode CE may be disposed on the electron control layer ECL. The second electrode CE may be commonly disposed in the unit pixel PXU illustrated in FIG. 6. That is, the second electrode CE may be commonly disposed over the emissive layers EML of the unit pixel PXU.

The layers from the buffer layer BFL to the eighth insulating layer INS8 may be referred to as the drive circuit layer 120. The layer in which the light emitting element OLED is disposed may be referred to as the display element layer 130.

The encapsulation layer 140 may be disposed on the light emitting element OLED. The encapsulation layer 140 may include an inorganic layer, an organic layer, and an inorganic layer that are sequentially stacked one above another. The inorganic layers may include an inorganic material and may protect the pixels from moisture/oxygen. The organic layer may include an organic material and may protect the element emitting element OLED from foreign matter such as dust particles.

The sensor layer 200 is disposed on the display layer 100. The sensor layer 200 may include the base layer 201, the first conductive layer 202, the sensing insulation layer 203, the second conductive layer 204, and the cover insulating layer 205. The base layer 201 may be defined as a first insulating layer of the sensor layer 200, the sensing insulation layer 203 may be defined as a second insulating layer of the sensor layer 200, and the cover insulating layer 205 may be defined as a third insulating layer of the sensor layer 200.

The base layer 201 may be an inorganic layer including at least one of silicon nitride, silicon oxy nitride, or silicon oxide. Alternatively, the base layer 201 may be an organic layer including an epoxy resin, an acrylic resin, or an imide-based resin. The base layer 201 may have a single-layer structure, or may have a multi-layer structure stacked in the third direction DR3.

Each of the first conductive layer 202 and the second conductive layer 204 may have a single-layer structure, or may have a multi-layer structure stacked in the third direction DR3. The second conductive layer 204 may be connected to the first conductive layer 202 through a fifth contact hole CNT-5 penetrating the sensing insulation layer 203.

Each of the first conductive layer 202 and the second conductive layer 204 that have a single-layer structure may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), indium zinc tin oxide (IZTO), or the like. In addition, the transparent conductive layer may include a conductive polymer such as poly(3,4-ethylenedioxythiophene) (PEDOT), a metal nano wire, or graphene.

Each of the first conductive layer 202 and the second conductive layer 204 that have a multi-layer structure may include metal layers. The metal layers may have, for example, a three-layer structure of titanium/aluminum/titanium. The conductive layer having a multi-layer structure may include at least one metal layer and at least one transparent conductive layer.

At least one of the sensing insulation layer 203 or the cover insulating layer 205 may include an inorganic film. The inorganic film may include at least one of aluminum oxide, titanium oxide, silicon oxide, silicon nitride, silicon oxy nitride, zirconium oxide, or hafnium oxide.

At least one of the sensing insulation layer 203 or the cover insulating layer 205 may include an organic film. The organic film may include at least one of an acrylic resin, a methacrylic resin, a polyisoprene resin, a vinyl resin, an epoxy resin, a urethane-based resin, a celluosic resin, a siloxane-based resin, a polyimide resin, a polyamide resin, or a perylene-based resin.

In this embodiment, the sensor layer 200 including the three insulating layers 201, 203, and 205 and the two conductive layers 202 and 204 has been described as an example. However, the present disclosure is not limited thereto. The sensor layer 200 may include four insulating layers and three conductive layers, or may include five insulating layers and four conductive layers.

The charging electrode layer 200-1 is disposed under the drive circuit layer 120. In this embodiment, the charging electrode layer 200-1 is disposed on the lower surface of the base layer 110. The charging electrode layer 200-1 may include a charging electrode PCE disposed on the lower surface of the base layer 110 and a protective layer 200-C that covers or surrounds the charging electrode PCE.

The charging electrode PCE may have a multi-layer structure or a single-layer structure made of metal having low resistance. The metal may include molybdenum, silver, titanium, copper, aluminum, or an alloy thereof. The protective layer 200-C may include an inorganic layer or an organic layer and may have a single-layer structure or a multi-layer structure.

Figure 8:
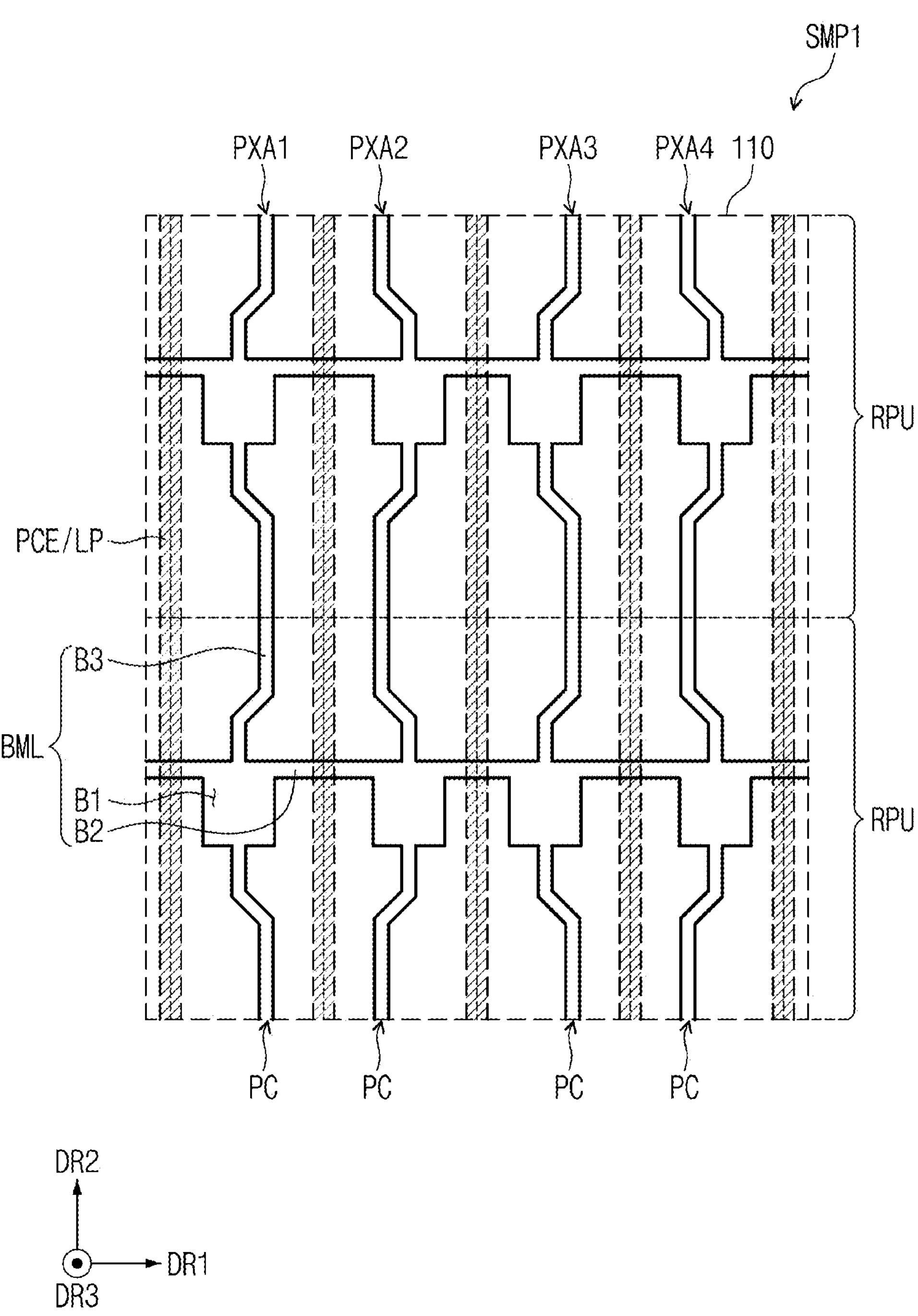
FIG. 8 is a plan view of a shielding layer according to an embodiment of the present disclosure.
Figure 9:
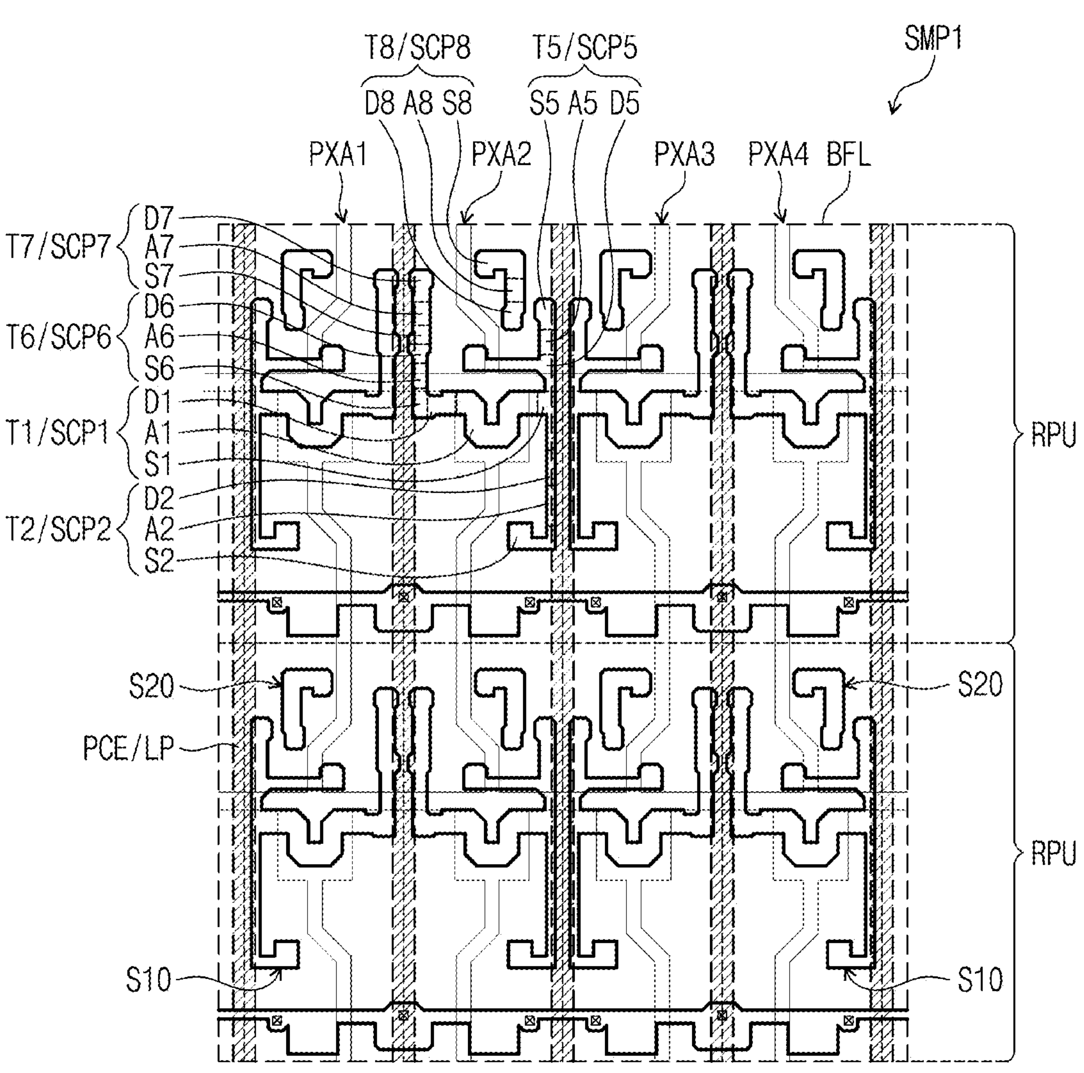
FIG. 9 is a plan view of a first semiconductor layer according to an embodiment of the present disclosure.
Figure 9:
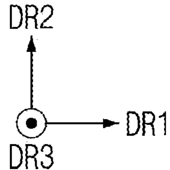
Figure 10:
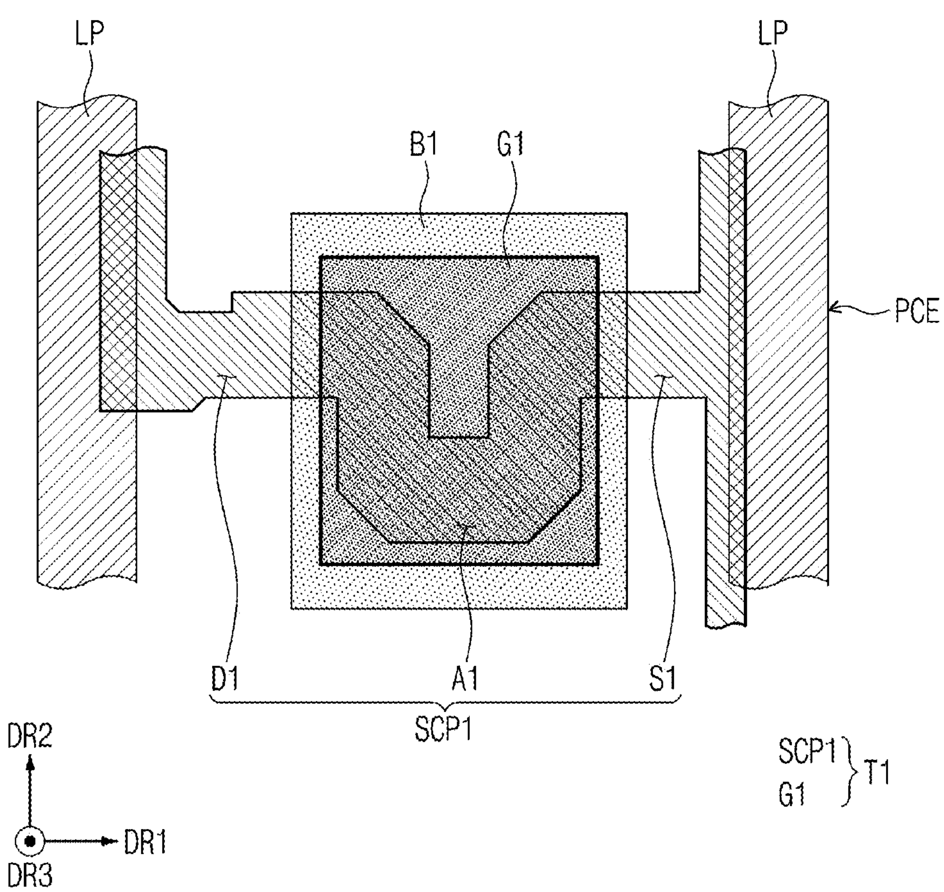
FIG. 10 is a plan view of a driving transistor according to an embodiment of the present disclosure.

FIG. 8 is a plan view of the shielding layer BML according to an embodiment of the present disclosure. FIG. 9 is a plan view of the first semiconductor layer SMP1 according to an embodiment of the present disclosure. FIG. 10 is a plan view of the driving transistor T1 according to an embodiment of the present disclosure.

In FIGS. 8 and 9, the two unit areas RPU described with reference to FIG. 6 are illustrated as an example. The shielding layer BML may include a first area B1 disposed in each of the first to fourth pixel areas PXA1, PXA2, PXA3, and PXA4, a second area B2 connecting the first areas B1 of the first to fourth pixel areas PXA1, PXA2, PXA3, and PXA4 in the first direction DR1, and a third area B3 connecting the first areas B1 of the first to fourth pixel areas PXA1, PXA2, PXA3, and PXA4 in the second direction DR2. In an embodiment, the first areas B1 have greater widths in the first direction DR1 and the second direction DR2 than the second area B2 and the third area B3.

The charging electrode PCE may include a plurality of line portions LP extending in the second direction DR2. The line portions LP may be arranged in the first direction DR1 so as to be spaced apart from each other. The line portions LP are disposed on the opposite sides of each of the first to fourth pixel areas PXA1, PXA2, PXA3, and PXA4 in the first direction DR1.

The line portions LP do not overlap the first areas B1 when viewed from above the plane. Each of the line portions LP may be disposed between two first areas B1 adjacent to each other in the first direction DR1 and may overlap the second area B2. The line portions LP may define the same charging channel. That is, one charging channel may include the line portions LP of FIG. 8.

As illustrated in FIG. 9, the first areas B1 cover the first semiconductor pattern areas SCP1 of the first to fourth pixel areas PXA1, PXA2, PXA3, and PXA4. That is, each of the first areas B1 has an area sufficient to allow the first semiconductor pattern area SCP1 to be disposed within the first area B1.

Referring to FIG. 9, the first semiconductor layer SMP1 corresponding to the first to fourth pixel areas PXA1, PXA2, PXA3, and PXA4 may be disposed on the buffer layer BFL.

The first semiconductor layer SMP1 includes a first pattern S10 disposed in each of the first to fourth pixel areas PXA1, PXA2, PXA3, and PXA4 and a second pattern S20 spaced apart from the first pattern S10. The first patterns S10 disposed in two adjacent pixel areas among the first to fourth pixel areas PXA1, PXA2, PXA3, and PXA4 may have bilateral symmetry, and the second patterns S20 disposed in the two adjacent pixel areas may have bilateral symmetry.

Portions of the first pattern S10 and the second pattern S20 may form the first, second, fifth, sixth, seventh, and eighth source areas S1, S2, S5, S6, S7, and S8, the first, second, fifth, sixth, seventh, and eighth drain areas D1, D2, D5, D6, D7, and D8, and the first, second, fifth, sixth, seventh, and eighth channel areas A1, A2, A5, A6, A7, and A8 of the first, second, fifth, sixth, seventh, and eighth transistors T1, T2, T5, T6, T7, and T8 described with reference to FIG. 5. Since the state illustrated in FIG. 9 corresponds to a state prior to doping, the channel areas A1, A2, A5, A6, A7, and A8 are not substantially distinguished from the source areas S1, S2, S5, S6, S7, and S8 and the drain areas D1, D2, D5, D6, D7, and D8.

The first pattern S10 includes the semiconductor pattern areas SCP1, SCP2, SCP5, SCP6, and SCP7 of the first, second, fifth, sixth, and seventh transistors T1, T2, T5, T6, and T7. The second pattern S20 includes the semiconductor pattern area SCP8 of the eighth transistor T8. Each of the channel areas A1, A2, A5, A6, A7, and A8 is disposed between a corresponding source area among the source areas S1, S2, S5, S6, S7, and S8 and a corresponding drain area among the drain areas D1, D2, D5, D6, D7, and D8.

Referring to FIG. 10, the arrangement relationship between the driving transistor T1 and the line portions LP illustrated in FIGS. 7, 8, and 9 is illustrated.

The first area B1 of the shielding layer BML, the first semiconductor pattern area SCP1, and the first gate electrode G1 are disposed between two adjacent line portions LP in the first direction DR1.

When the line portions LP do not overlap the channel area A1 of the first semiconductor pattern area SCP1, a variation in the threshold voltage Vth of the first transistor T1 may be decreased. If one of the line portions LP overlaps the first semiconductor pattern area SCP1, a parasitic capacitance is formed between the line portion LP and the first area B1 of the shielding layer BML and between the first area B1 of the shielding layer BML and the first semiconductor pattern area SCP1 even though the first area B1 of the shielding layer BML is disposed between the line portion LP and the first semiconductor pattern area SCP1, and electric current flowing to the line portion LP affects the first semiconductor pattern area SCP1. Alternating Current (AC) current flowing to the line portion LP may form a leakage current path in the channel area A1 of the first semiconductor pattern area SCP1 and may vary the threshold voltage Vth of the first transistor T1.

Although an effect obtained by the line portions LP not overlapping the driving transistor T1 has been described in this embodiment, the present disclosure is not limited thereto. In an embodiment, the line portions LP do not overlap the second to eighth transistors T2 to T8 when viewed from above the plane. In particular, since the semiconductor pattern areas SCP2, SCP5, SCP6, and SCP7 of the second, fifth, sixth, and seventh transistors T2, T5, T6, and T7 are disposed on the same layer as the semiconductor pattern area SCP1 of the driving transistor T1, interference similar to that between the driving transistor T1 and the line portion LP may occur between the second, fifth, sixth, and seventh transistors T2, T5, T6, and T7 and the line portion LP. Since the line portions LP do not overlap the second to eighth transistors T2 to T8, the above-described interference may be suppressed.

In an embodiment of the present disclosure, the shielding layer BML is omitted, and if the line portions LP overlap the channel area A1 of the first semiconductor pattern area SCP1, a parasitic capacitance may be formed between the line portion LP and the channel area A1 of the first semiconductor pattern area SCP1, and the defect described above may become larger. When the line portions LP do not overlap the channel area A1 of the first semiconductor pattern area SCP1, the above-described defect may be suppressed even though the shielding layer BML is omitted.

Figure 11:
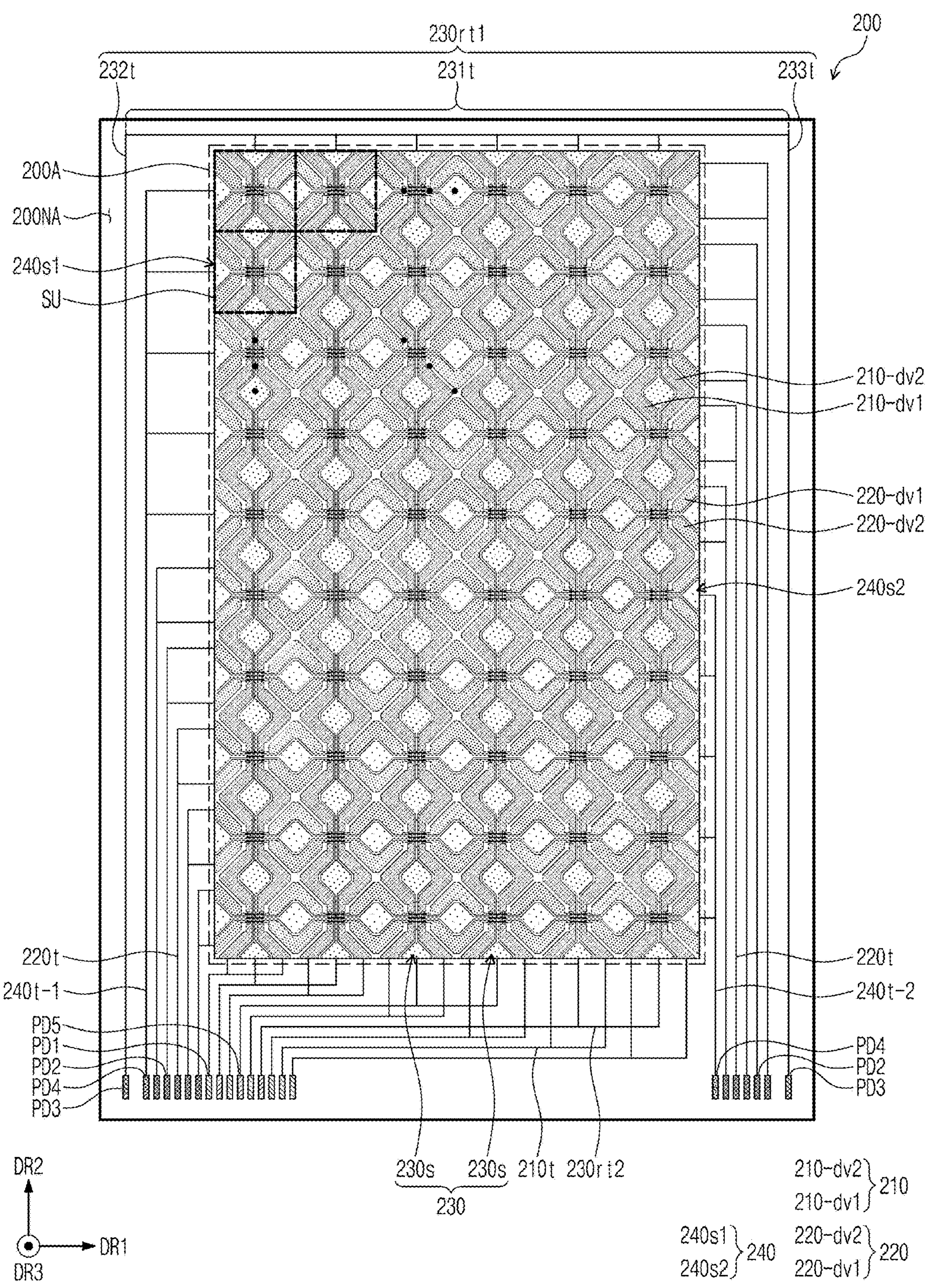
FIG. 11 is a plan view of a sensor layer according to an embodiment of the present disclosure.
Figure 12:
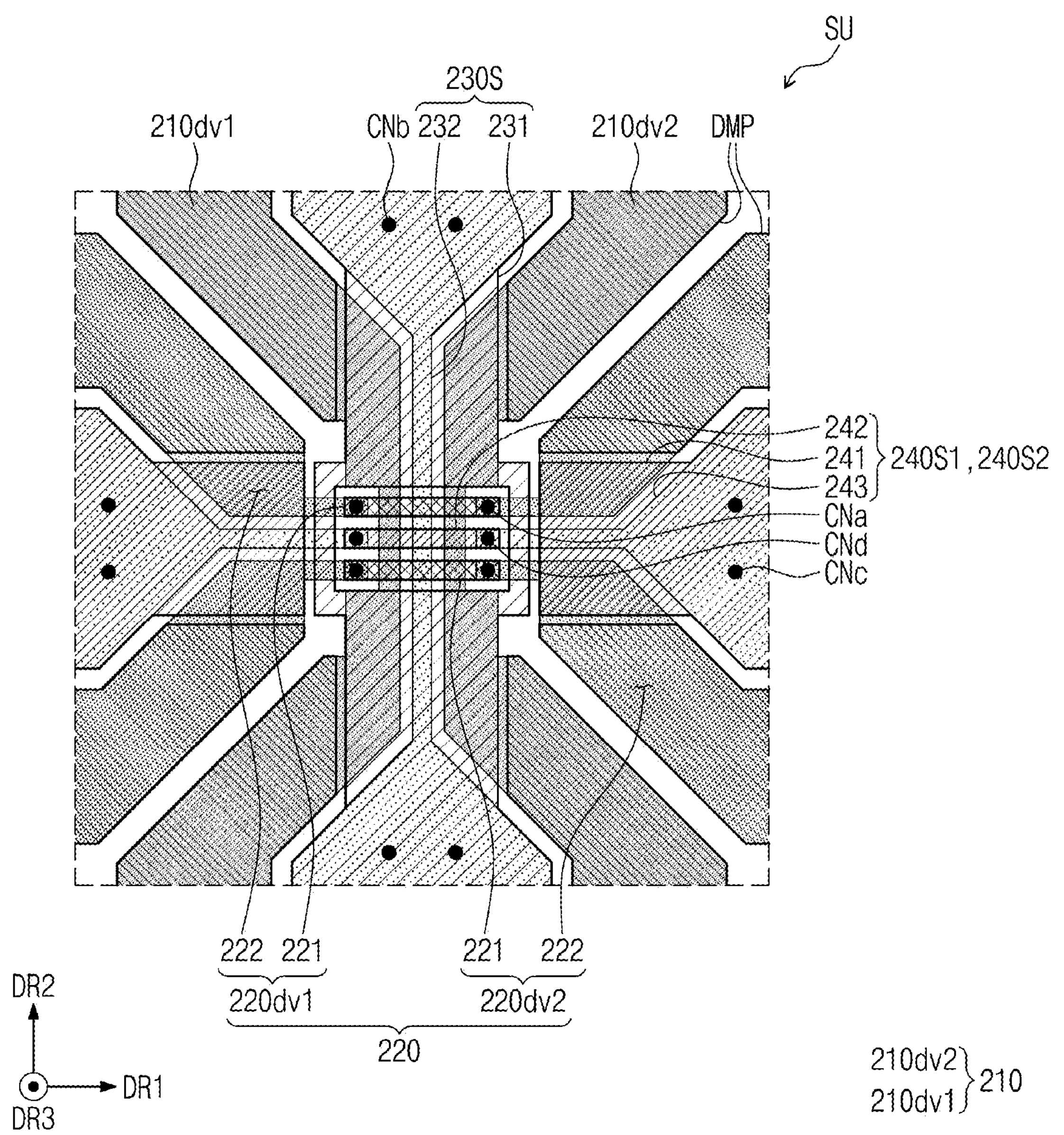
FIG. 12 is an enlarged plan view illustrating one sensing unit according to an embodiment of the present disclosure.
Figure 13A:
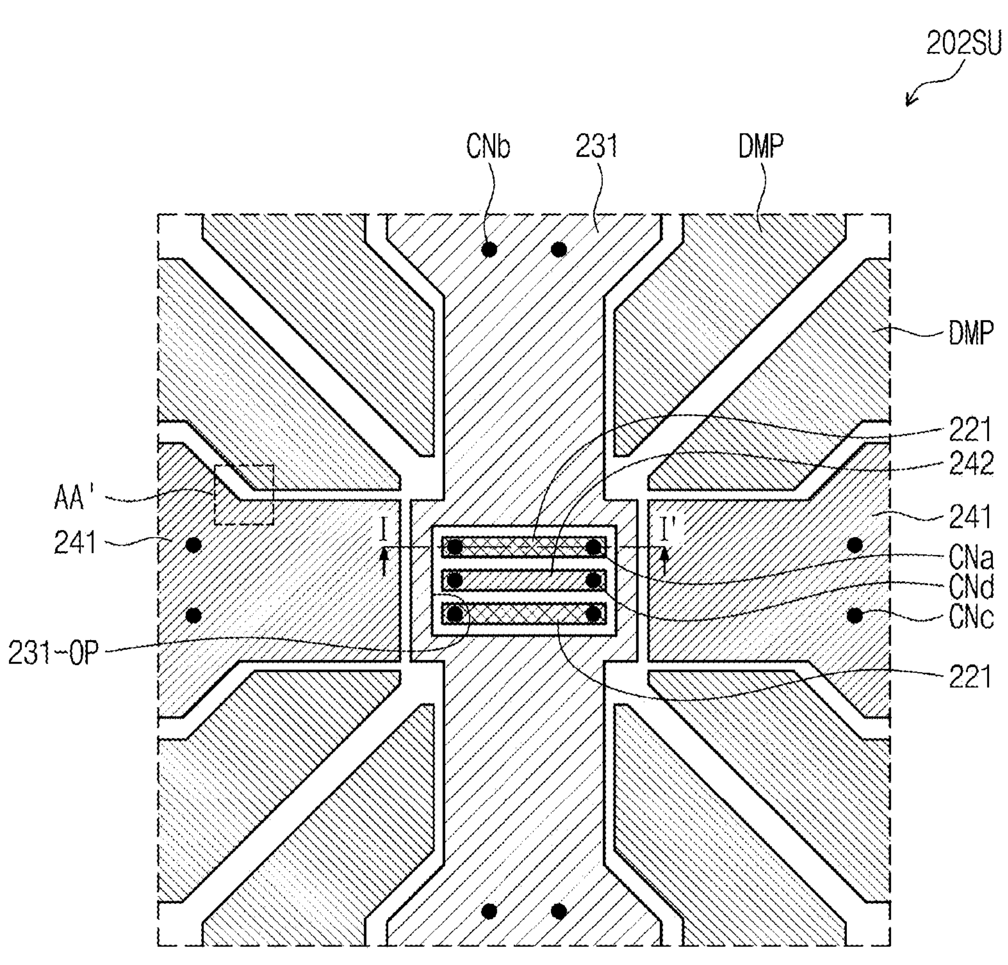
FIG. 13A is a plan view illustrating a first conductive layer of the sensing unit according to an embodiment of the present disclosure.
Figure 13A:
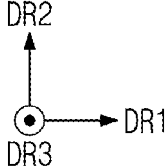
Figure 13B:
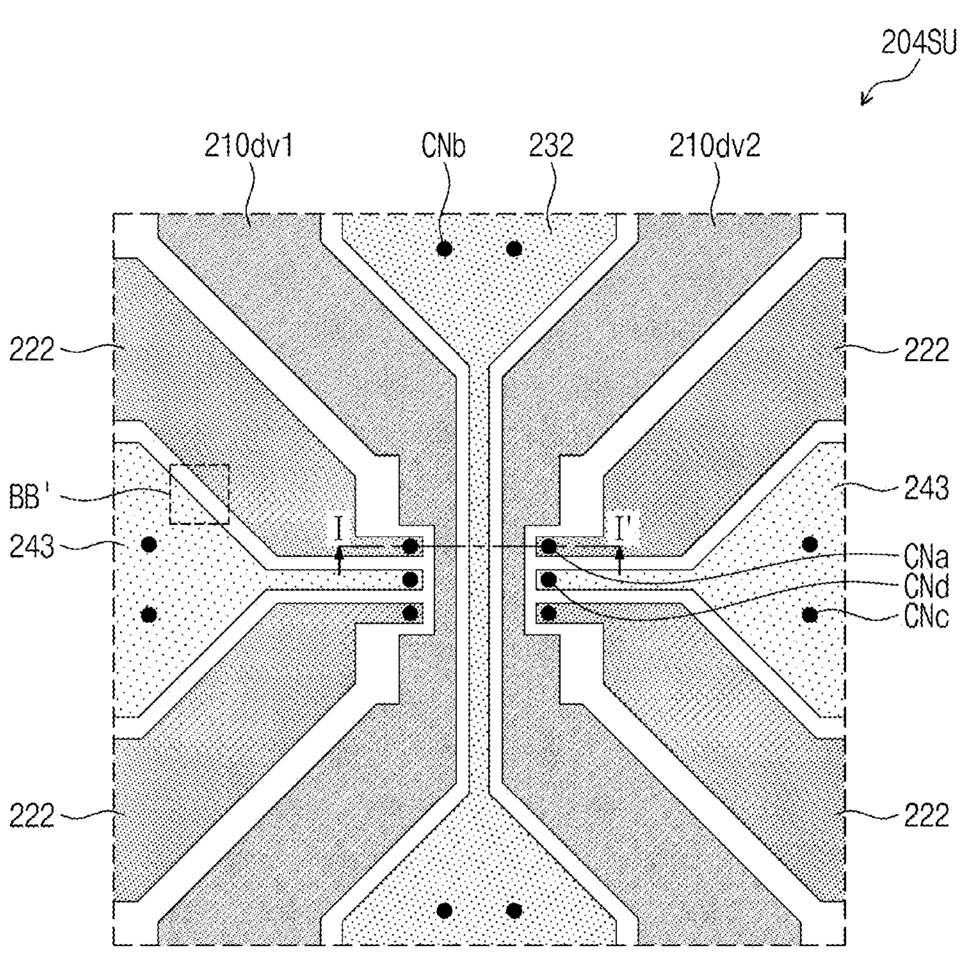
FIG. 13B is a plan view illustrating a second conductive layer of the sensing unit according to an embodiment of the present disclosure.
Figure 13B:
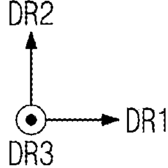
Figure 14:
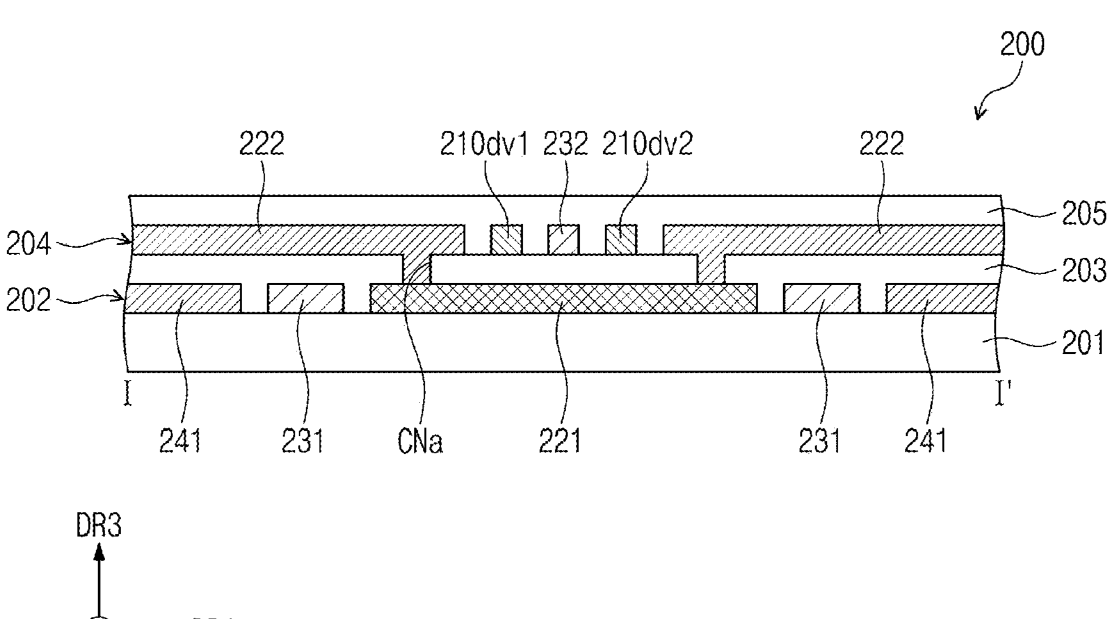
FIG. 14 is a sectional view of the sensor layer taken along line I-I' illustrated in each of FIGS. 13A and 13B according to an embodiment of the present disclosure.

FIG. 11 is a plan view of the sensor layer 200 according to an embodiment of the present disclosure. FIG. 12 is an enlarged plan view illustrating one sensing unit SU according to an embodiment of the present disclosure. FIG. 13A is a plan view illustrating a first conductive layer 202SU of the sensing unit SU according to an embodiment of the present disclosure. FIG. 13B is a plan view illustrating a second conductive layer 204SU of the sensing unit SU according to an embodiment of the present disclosure. FIG. 14 is a sectional view of the sensor layer 200 taken along line I-I' illustrated in each of FIGS. 13A and 13B according to an embodiment of the present disclosure.

Referring to FIG. 11, a sensing area 200A and a peripheral area 200NA adjacent to the sensing area 200A may be present in the sensor layer 200. A display area corresponding to the sensing area 200A and a non-display area corresponding to the peripheral area 200NA may be present in the display layer 100 of FIGS. 3 and 7. In FIG. 6, a partial region of the display area DA is illustrated.

The sensor layer 200 may include a plurality of first electrodes 210, a plurality of second electrodes 220, a plurality of third electrodes 230, and a plurality of fourth electrodes 240 disposed in the sensing area 200A. Each of the first electrodes 210 may cross the second electrodes 220. Each of the third electrodes 230 may cross the fourth electrodes 240.

Each of the first electrodes 210 may extend in the second direction DR2. The first electrodes 210 may be arranged in the first direction DR1 so as to be spaced apart from each other. Each of the second electrodes 220 may extend in the first direction DR1. The second electrodes 220 may be arranged in the second direction DR2 so as to be spaced apart from each other. The sensing unit SU of the sensor layer 200 may be an area where one first electrode 210 and one second electrode 220 cross each other. In FIG. 11, six first electrodes 210 and ten second electrodes 220 are illustrated as an example, and thus sixty sensing units SU are shown. However, the number of first electrodes 210 and the number of second electrodes 220 are not limited thereto.

Referring to FIGS. 11 and 12, each of the first electrodes 210 may include first divided electrodes 210*dv*1 and 210*dv*2. The first divided electrodes 210*dv*1 and 210*dv*2 may extend in the second direction DR2 and may be spaced apart from each other in the first direction DR1. The first divided electrodes 210*dv*1 and 210*dv*2 may have shapes having line symmetry with respect to a line extending in the second direction DR2.

Each of the second electrodes 220 may include second divided electrodes 220*dv*1 and 220*dv*2. The second electrodes 220 may extend in the first direction DR1 and may be spaced apart from each other in the second direction DR2. The second divided electrodes 220*dv*1 and 220*dv*2 may have shapes having line symmetry with respect to a line extending in the first direction DR1.

Referring to FIGS. 12, 13A, 13B, and 14, each of the second divided electrodes 220*dv*1 and 220*dv*2 may include a bridge pattern 221 and two sensing patterns 222 disposed in the sensing unit SU. In an embodiment, the bridge pattern 221 is disposed on a layer different from the layer on which the sensing patterns 222 are disposed, and the bridge pattern 221 and the sensing patterns 222 may be electrically connected with each other through a first contact hole CNa. Contact holes to be described below, including the first contact hole CNa, may penetrate the sensing insulation layer 203 like the fifth contact hole CNT-5 of FIG. 7. For example, the bridge pattern 221 may be included in the first conductive layer 202SU, and the sensing patterns 221 and the first divided electrodes 210*dv*1 and 210*dv*2 may be included in the second conductive layer 204SU. The first conductive layer 202SU may be included in the first conductive layer 202 of FIG. 7, and the second conductive layer 204SU may be included in the second conductive layer 204 of FIG. 7. Conductive patterns and/or electrodes may be formed from a conductive layer through a photolithography process.

Referring to FIG. 11, each of the third electrodes 230 may extend in the second direction DR2. The third electrodes 230 may be arranged in the first direction DR1 so as to be spaced apart from each other. In an embodiment of the present disclosure, each of the third electrodes 230 may include a plurality of first auxiliary electrodes 230*s* connected in parallel. The number of first auxiliary electrodes 230*s* included in each of the third electrodes 230 may be variously modified. For example, as the number of first auxiliary electrodes 230*s* included in each of the third electrodes 230 is increased, the resistance of the third electrode 230 may be lowered, and thus power efficiency and sensing sensitivity may be increased. In contrast, as the number of first auxiliary electrodes 230*s* included in each of the third electrodes 230 is decreased, a loop coil pattern formed using the third electrodes 230 may be implemented in more various forms.

Although FIG. 11 illustrates an example that one third electrode 230 includes two first auxiliary electrodes 230*s*, the present disclosure is not particularly limited thereto. In an embodiment of the present disclosure, each of the third electrodes 230 may include one first auxiliary electrode 230*s*. Referring to FIG. 11, the first auxiliary electrodes 230*s* may be disposed to correspond to the first electrodes 210 in a one-to-one manner. Accordingly, a portion of one first auxiliary electrode 230*s* may be disposed in one sensing unit SU illustrated in FIGS. 11 and 12. In an embodiment of the present disclosure, one third electrode 230 may include three first auxiliary electrode 230*s*.

Referring to FIGS. 11 to 14, a coupling capacitor may be defined between one first electrode 210 and one first auxiliary electrode 230*s*. In this case, an induced current generated when the pen PN is sensed may be transferred from the first auxiliary electrode 230*s* to the first electrode 210 through the coupling capacitor. That is, the first auxiliary electrode 230*s* may serve to supplement a signal transferred from the first electrode 210 to the sensor driver 200C. Accordingly, the greatest effect may be obtained when the phase of a signal induced in the first auxiliary electrode 230*s* coincides with the phase of a signal induced in the first electrode 210. Accordingly, the centers of the first electrodes 210 in the first direction DR1 may overlap the centers of the first auxiliary electrodes 230*s* in the first direction DR1.

In an embodiment of the present disclosure, since one third electrode 230 includes two first auxiliary electrodes 230*s*, the one third electrode 230 may correspond to (or, overlap) two first electrodes 210. Accordingly, the number of third electrodes 230 included in the sensor layer 200 may be smaller than the number of first electrodes 210. For example, the number of first electrodes 210 may be equal to the product of the number of third electrodes 230 included in the sensor layer 200 and the number of first auxiliary electrodes 230*s* included in each of the third electrodes 230. In FIG. 11, the number of first electrodes 210 may be six, the number of third electrodes 230 may be three, and the number of first auxiliary electrodes 230*s* included in each of the third electrodes 230 may be two.

The fourth electrodes 240 may be arranged in the second direction DR2. The fourth electrodes 240 may extend in the first direction DR1. In an embodiment of the present disclosure, the fourth electrodes 240 may be divided into two groups. The fourth electrodes 240 belonging to the same group are connected to the same trace line. The fourth electrodes 240 divided into two groups may be referred to as second auxiliary electrodes 240*s*1 or 240*s*2. In this embodiment, the second auxiliary electrodes 240*s*1 or 240*s*2 may be referred to as second-first auxiliary electrode 240*s*1 or second-second auxiliary electrodes 240*s*2. In this embodiment, the second-first auxiliary electrodes 240*s*1 and the second-second auxiliary electrodes 240*s*2 are connected to different trace lines 240*t*-1 and 240*t*-2. The second-first auxiliary electrodes 240*s*1 are connected to the same trace line 240$t$-1, and the second-second auxiliary electrodes 240$s$2 are connected to the same trace line 240$t$-2.

In an embodiment of the present disclosure, the fourth electrodes 240 may be divided into two or more groups. When the fourth electrodes 240 are connected to different trace lines, the fourth electrodes 240 may be divided into different groups. The fourth electrodes 240 divided into different groups may receive a synchronized signal or the same signal through different fourth trace lines. In an embodiment of the present disclosure, the fourth electrodes 240 belong to one group and the fourth electrodes 240 are connected to one fourth trace line. In an embodiment of the present disclosure, the fourth electrodes 240 include three groups. In an embodiment of the fourth electrodes 240 including the three groups, two groups are disposed on the left side of the sensing area 200A, and one group is disposed on the right side of the sensing area 200A. In an embodiment of the present disclosure, the fourth electrodes 240 include four groups. In an embodiment of the fourth electrodes 240 including the four groups, two groups are disposed on the left side of the sensing area 200A, and the remaining two groups are disposed on the right side of the sensing area 200A. The two groups disposed on the left side in the second direction DR2 may be disposed farther away from or closer to second pads PD2 or third pads PD3 than the two groups disposed on the right side. The two groups disposed on the left side in the second direction DR2 and the two groups disposed on the right side in the second direction DR2 may be disposed in zigzags from the second pads PD2 or the third pads PD3.

In an embodiment, the routing directions of the second-first auxiliary electrodes 240$s$1 and the second-second auxiliary electrodes 240$s$2 are different from each other. For example, when the routing directions are different from each other, the connection positions of electrodes and trace lines are different from each other. For example, a first connection position of the fourth trace line 240$t$-1 electrically connected with the second-first auxiliary electrodes 240$s$1 may be different from a second connection position of the fourth trace line 240$t$-2 electrically connected with the second-second auxiliary electrodes 240$s$2. The first connection position may be a left end with respect to the second-first auxiliary electrodes 240$s$1, and the second connection position may be a right end with respect to the second-second auxiliary electrodes 240$s$2.

FIG. 11 illustrates an example where five second-first auxiliary electrodes 240$s$1 are electrically connected together and five second-second auxiliary electrodes 240$s$2 are electrically connected together. In an embodiment of the present disclosure, the number of second-first auxiliary electrodes 240$s$1 and the number of second-second auxiliary electrodes 240$s$2 are different from each other.

In an embodiment of the present disclosure, as the number of second-first auxiliary electrodes 240$s$1 is increased and the number of second-second auxiliary electrodes 240$s$2 is increased, the area of an electrode electrically defined as one may be increased. In addition, the resistances of the electrode electrically defined as one may be lowered, and thus the sensing sensitivity for the second input 3000 (refer to FIG. 4) may be increased.

Referring to FIGS. 11 to 14, a coupling capacitor may be defined between one second electrode 220 and one second auxiliary electrode 240$s$1 or 240$s$2. In this case, an induced current generated when the pen PN is sensed may be transferred from the second auxiliary electrode 240$s$1 or 240$s$2 to the second electrode 220 through the coupling capacitor. That is, the second auxiliary electrode 240$s$1 or 240$s$2 may serve to supplement a signal transferred from the second electrode 220 to the sensor driver 200C. Accordingly, the greatest effect may be obtained when the phase of a signal induced in the second auxiliary electrode 240$s$1 or 240$s$2 coincides with the phase of a signal induced in the second electrode 220. Accordingly, the center of each of the second electrodes 220 in the second direction DR2 may overlap the center of the second auxiliary electrode 240$s$1 or 240$s$2 in the second direction DR2.

Referring to FIGS. 12, 13A, and 13B, each of the first auxiliary electrodes 230$s$ may include a third-first pattern 231 and a third-second pattern 232. Meanwhile, the terms "third-first pattern 231 and third-second pattern 232" are only used for the purpose of distinguishing the patterns from each other. When the third-first pattern 231 is referred to as a first pattern, the third-second pattern 232 may be referred to as a second pattern.

In an embodiment, the third-first pattern 231 and the third-second pattern 232 are disposed on different layers. The third-first pattern 231 and the third-second pattern 232 may be electrically connected with each other through a second contact CNb. The third-first pattern 231 may be included in the first conductive layer 202SU, and the third-second pattern 232 may be included in the second conductive layer 204SU.

In an embodiment of the present disclosure, one of the third-first pattern 231 and the third-second pattern 232 are omitted. In an embodiment of the present disclosure, even though the third-first pattern 231 and the third-second pattern 232 are disposed, the third-first pattern 231 and the third-second pattern 232 may not be electrically connected with each other. In this case, one of the third-first pattern 231 and the third-second pattern 232 may correspond to the first auxiliary electrodes 230$s$, and the other one of the third-first pattern 231 and the third-second pattern 232 may correspond to a dummy electrode (or, a floating electrode).

In an embodiment of the present disclosure, a portion of the third-first pattern 231 overlaps a portion of each of the first divided electrodes 210$dv$1 and 210$dv$2. Accordingly, coupling capacitance may be provided (or, formed) between the first electrode 210 and the third electrode 230. The third-first pattern 231 may have an opening 231-OP defined therein. The bridge pattern 221 described above and a fourth-second pattern 242 to be described below may be disposed in the opening 231-OP.

Referring to FIGS. 12, 13A, and 13B, each of the second auxiliary electrodes 240$s$1 or 240$s$2 may include two fourth-first patterns 241, the fourth-second pattern 242, and two fourth-third patterns 243 disposed in the sensing unit SU. Meanwhile, the terms "fourth-first pattern 241, fourth-second pattern 242, and fourth-third pattern 243" are only used for the purpose of distinguishing the patterns from one another. When the fourth-first pattern 241 is referred to as a first pattern, the fourth-second pattern 242 may be referred to as a second pattern, and the fourth-third pattern 243 may be referred to as a third pattern.

In an embodiment, the fourth-first pattern 241 and the fourth-second pattern 242 are disposed on the same layer, and the fourth-third pattern 243 are disposed on a layer different from the layer on which the fourth-first pattern 241 and the fourth-second pattern 242 are disposed. The fourth-first pattern 241 and the fourth-third pattern 243 may be electrically connected with each other through a third contact CNc, and the fourth-second pattern 242 and the fourth-third pattern 243 may be electrically connected with each other through a fourth contact CNd. The fourth-first pattern 241 and the fourth-second pattern 242 may be included in the first conductive layer 202SU, and the fourth-third pattern 243 may be included in the second conductive layer 204SU.

Referring to FIGS. 12, 13A, and 13B, a portion of the fourth-first pattern 241 may overlap the sensing pattern 222 of each of the second divided electrodes 220*dv*1 and 220*dv*2. Accordingly, a coupling capacitor may be defined (or, provided or formed) between the second electrode 220 and the fourth electrode 240.

In an embodiment of the present disclosure, the first conductive layer 202SU further includes dummy patterns DMP. Each of the dummy patterns DMP may be electrically floated or electrically grounded. Some of the dummy patterns DMP may overlap the first divided electrodes 210*dv*1 and 210*dv*2, and the other dummy patterns DMP may overlap the sensing patterns 222. In an embodiment of the present disclosure, the dummy patterns DMP are omitted. In an embodiment of the present disclosure, the dummy patterns DMP are electrically connected with an overlapping electrode of the first divided electrodes 210*dv*1 and 210*dv*2 to further increase sensing sensitivity.

Referring to FIG. 11, the sensor layer 200 may further include a plurality of first trace lines 210*t* disposed in the peripheral area 200NA, a plurality of first pads PD1 connected to the first trace lines 210*t* in a one-to-one correspondence, a plurality of second trace lines 220*t*, and a plurality of second pads PD2 connected to the second trace lines 220*t* in a one-to-one correspondence.

The first trace lines 210*t* may be electrically connected to the first electrodes 210 in a one-to-one correspondence. Two first divided electrodes 210*dv*1 and 210*dv*2 included in one first electrode 210 may be connected to one first trace line among the first trace lines 210*t*. Each of the first trace lines 210*t* may include a plurality of branch portions for connection to the two first divided electrodes 210*dv*1 and 210*dv*2. In an embodiment of the present disclosure, the two first divided electrodes 210*dv*1 and 210*dv*2 may be connected with each other in the sensing area 200A.

The second trace lines 220*t* may be electrically connected to the second electrodes 220 in a one-to-one correspondence. Two second divided electrodes 220*dv*1 and 220*dv*2 included in one second electrode 220 may be connected to one second trace line among the second trace lines 220*t*. Each of the second trace lines 220*t* may include a plurality of branch portions for connection to the two second divided electrodes 220*dv*1 and 220*dv*2. In an embodiment of the present disclosure, the two second divided electrodes 210*dv*1 and 210*dv*2 are connected with each other in the sensing area 200A.

Referring to FIG. 11, the sensor layer 200 may further include a third trace line 230*rt*1 disposed in the peripheral area 200NA, two third pads PD3 connected to one end and an opposite end of the third trace line 230*rt*1, two fourth trace lines 240*t*-1 and 240*t*-2, two fourth pads PD4 connected to the fourth trace lines 240*t*-1 and 240*t*-2, respectively, fifth trace lines 230*rt*2, and fifth pads PD5 connected to the fifth trace lines 230*rt*2 in a one-to-one correspondence.

In an embodiment, the third trace line 230*rt*1 is electrically connected to all of the third electrodes 230. The third trace line 230*rt*1 may include a first line portion 231*t* that extends in the first direction DR1 and that is electrically connected to first ends of the third electrodes 230, a second line portion 232*t* extending from a first end of the first line portion 231*t* in the second direction DR2, and a third line portion 233*t* extending from a second end of the first line portion 231*t* in the second direction DR2. One end of the second line portion 232*t* is connected to the third pad PD3, and one end of the third line portion 233*t* is connected to the third pad PD3. In an embodiment of the present disclosure, at least one of the second line portion 232*t* or the third line portion 233*t* is omitted. Accordingly, at least one of the second pad PD2 or the third pad PD3 may be omitted.

The fifth trace lines 230*rt*2 may be connected to the third electrodes 230 in a one-to-one correspondence. That is, the number of fifth trace lines 230*rt*2 may correspond to the number of third electrodes 230. In FIG. 11, three fifth trace lines 230*rt*2 are illustrated as an example.

The fourth trace lines 240*t*-1 and 240*t*-2 may be spaced apart from each other with the sensing area 200A therebetween. One end of each of the second-first auxiliary electrodes 240*s*1 may be connected to one fourth trace line 240*t*-1. One end of each of the second-second auxiliary electrodes 240*s*2 may be connected to the other fourth trace line 240*t*-2.

Although the sensor layer 200 formed from the first conductive layer 202 and the second conductive layer 204 of FIG. 5 has been described in detail with reference to FIGS. 11 to 14, the present disclosure is not limited thereto.

Figure 15A:
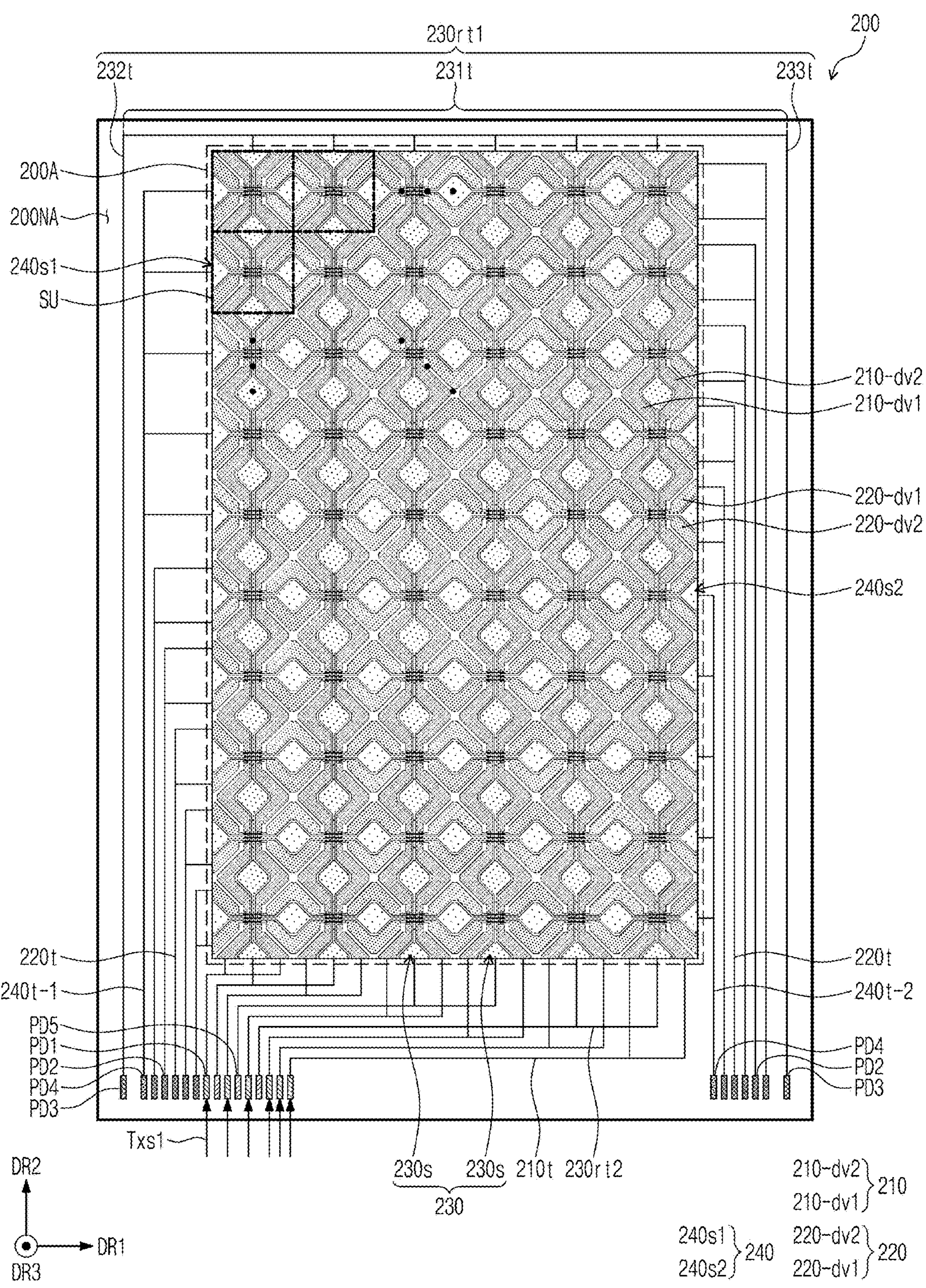
FIGS. 15A and 15B are views illustrating a first mode according to an embodiment of the present disclosure.
Figure 15B:
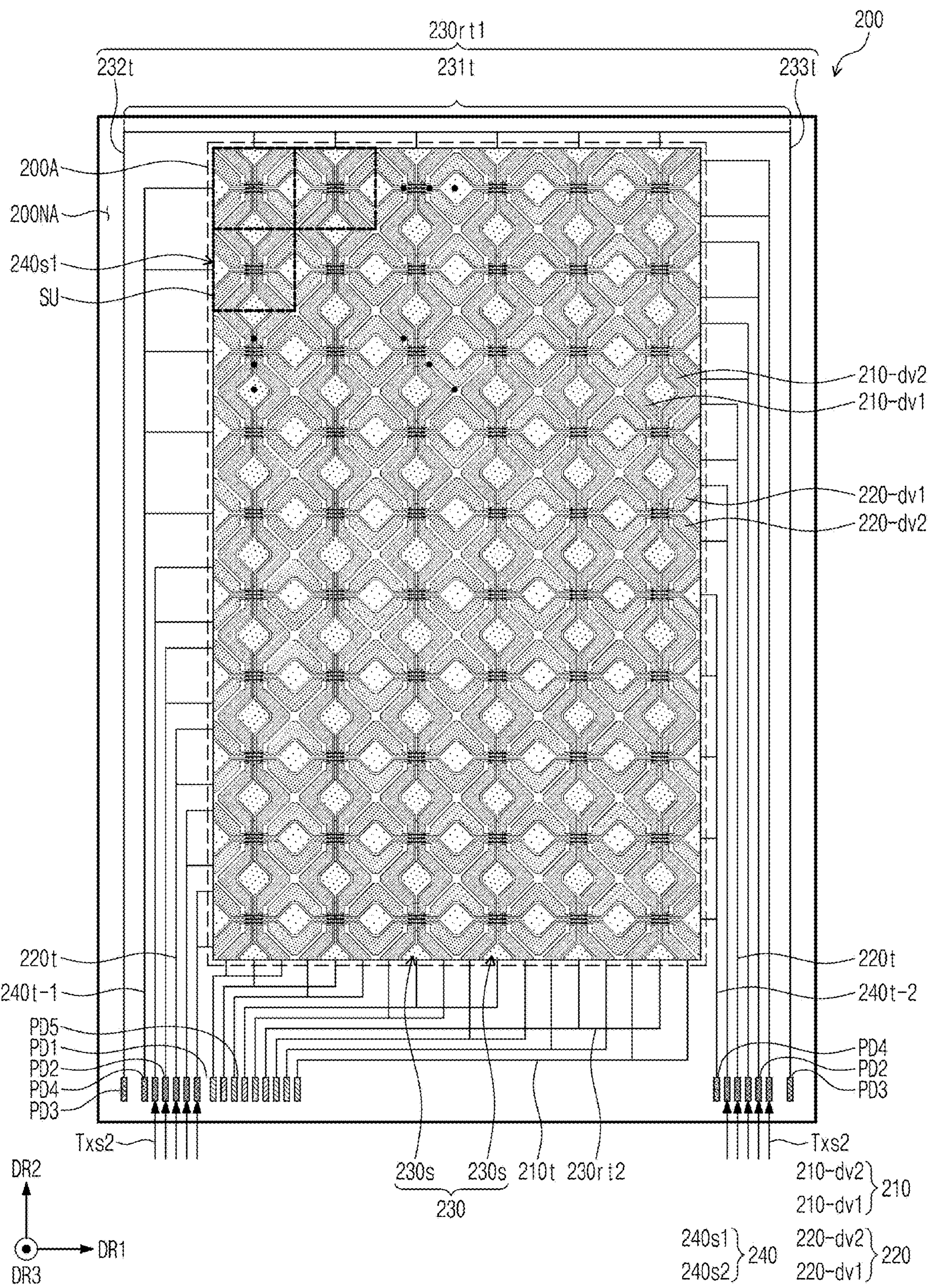

FIGS. 15A and 15B are views for explaining a first mode according to an embodiment of the present disclosure.

Referring to FIGS. 15A and 15B, in an embodiment of the present disclosure, the first mode may include a self-capacitance detection mode. The self-capacitance detection mode may include a first sub-section and a second sub-section. FIG. 15A is a view for explaining an operation in the first sub-section, and FIG. 15B is a view for explaining an operation in the second sub-section.

In the self-capacitance detection mode, the sensor driver 200C (refer to FIG. 4) outputs driving signals Txs1 and Txs2 to the first electrodes 210 and the second electrodes 220 and reads changed signals after a certain period of time. The sensor driver 200C may calculate input coordinates by sensing a change in the capacitance of each of the first electrodes 210 and the second electrodes 220. Referring to FIG. 15A, in the first sub-section, the sensor driver 200C outputs the driving signal Txs1 to the first trace lines 210*t*. Referring to FIG. 15B, in the second sub-section, the sensor driver 200C outputs the driving signal Txs2 to the second trace lines 220*t*. Within the first sub-section, the sensor driver 200C may sense a signal changed from the driving signal Txs1 through the first trace lines 210*t*. Within the second sub-section, the sensor driver 200C may sense a signal changed from the driving signal Txs2 through the second trace lines 220*t*.

The third electrodes 230 are electrically connected with the third trace line 230*rt*1 and the fifth trace lines 230*rt*2, and the fourth electrodes 240 are electrically connected with the fourth trace lines 240*t*-1 and 240*t*-2. In an embodiment of the self-capacitance detection mode, the third electrodes 230 and the fourth electrodes 240 are all be grounded. Accordingly, noise should not be introduced through the third electrodes 230 and the fourth electrodes 240.

In an embodiment of the present disclosure, a reference potential or voltage may be applied to the third electrodes 230 and the fourth electrodes 240. In an embodiment of the present disclosure, a signal in phase with a transmission signal may be applied to the third electrodes 230 and the fourth electrodes 240. Accordingly, noise should not be introduced through the third electrodes 230 and the fourth electrodes 240.

Figure 16:
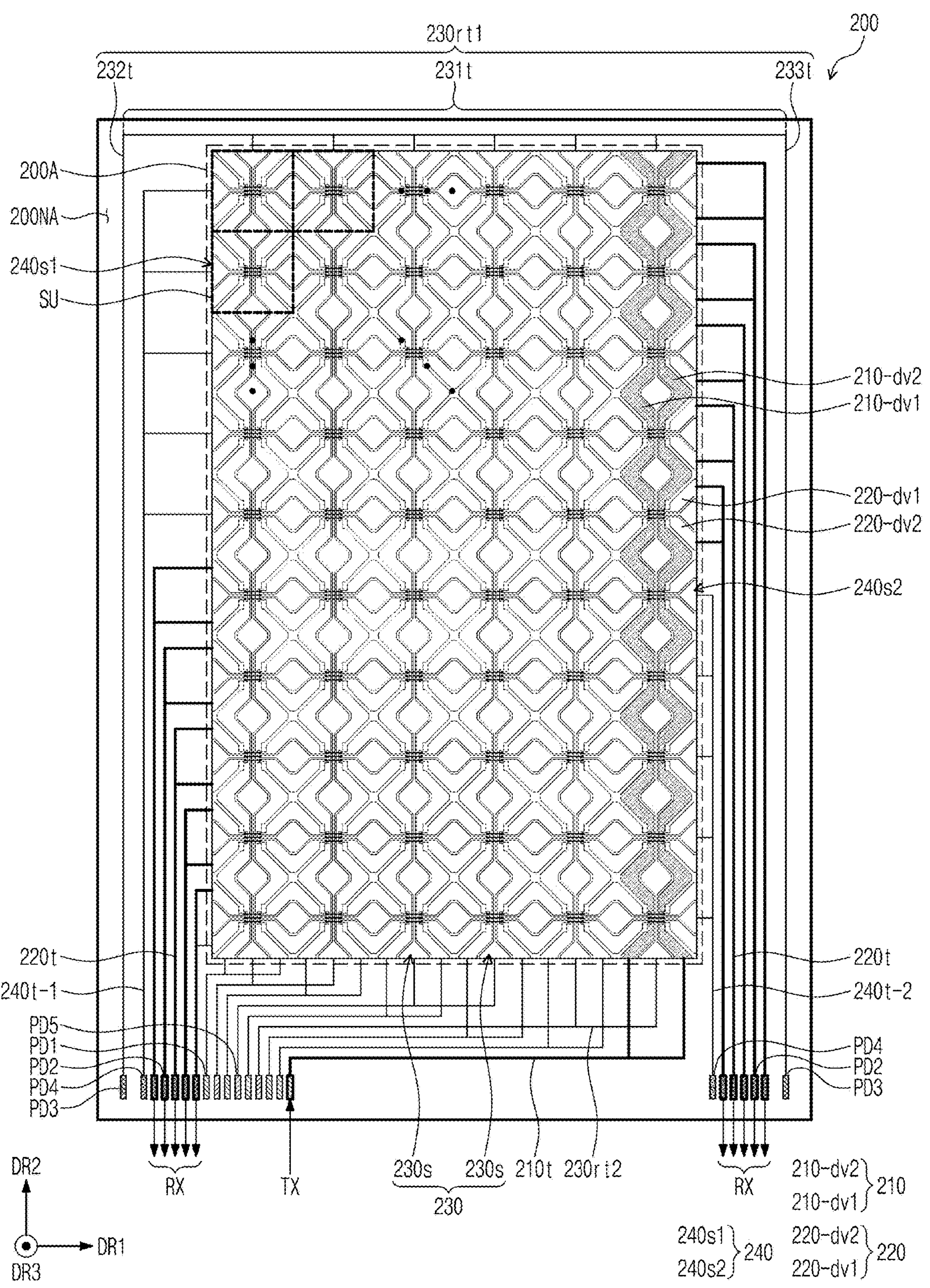
FIG. 16 is a view illustrating the first mode according to an embodiment of the present disclosure.

FIG. 16 is a view for explaining the first mode according to an embodiment of the present disclosure.

Referring to FIG. 16, in an embodiment of the present disclosure, the first mode may further include a mutual capacitance detection mode. In the mutual capacitance detection mode, the sensor driver 200C (refer to FIG. 4) may sequentially provide a transmission signal TX (or, a driving signal) to the first electrodes 210 and may detect the coordinates for the first input 2000 (refer to FIG. 4) using a reception signal RX (or, a detection signal) detected through the second electrodes 220. For example, the sensor driver 200C may be configured to sense a change in the mutual capacitance between the first electrodes 210 and the second electrodes 220 capacitively coupled with each other to calculate input coordinates. In an embodiment of the present disclosure, the sensor driver 200C sequentially provides the transmission signal TX to the second electrodes 220 and may detect the coordinates for the first input 2000 (refer to FIG. 4) using the reception signal RX detected through the first electrodes 210. The above-described driving methods may be alternately executed. For example, the self-capacitance detection mode and the mutual capacitance detection mode are typically not executed at the same time since they may conflict with one another.

FIG. 16 illustrates an example where the transmission signal TX is provided to one first electrode 210 and the reception signal RX is output from the second electrodes 220. In FIG. 16, to clarify the expression of a signal, one first electrode 210 to which the transmission signal TX is provided is illustrated with hatching. The sensor driver 200C may sense a change in capacitance between the first electrodes 210 and the second electrodes 220 and may detect the input coordinates for the first input 2000.

In an embodiment of the mutual capacitance detection mode, the third electrodes 230 and the fourth electrodes 240 are all grounded. Accordingly, noise should not be introduced through the third electrodes 230 and the fourth electrodes 240. In an embodiment of the present disclosure, a reference potential or voltage is applied to the third electrodes 230 and the fourth electrodes 240. In an embodiment of the present disclosure, a signal in phase with a transmission signal is applied to the third electrodes 230 and the fourth electrodes 240. Accordingly, noise should not be introduced through the third electrodes 230 and the fourth electrodes 240.

In the first mode, the sensor driver 200C (refer to FIG. 4) may drive the first electrodes 210 and the second electrodes 220 in the self-capacitance detection mode or the mutual capacitance detection mode, and the self-capacitance detection mode and the mutual capacitance detection mode may be alternately repeated.

Figure 17A:
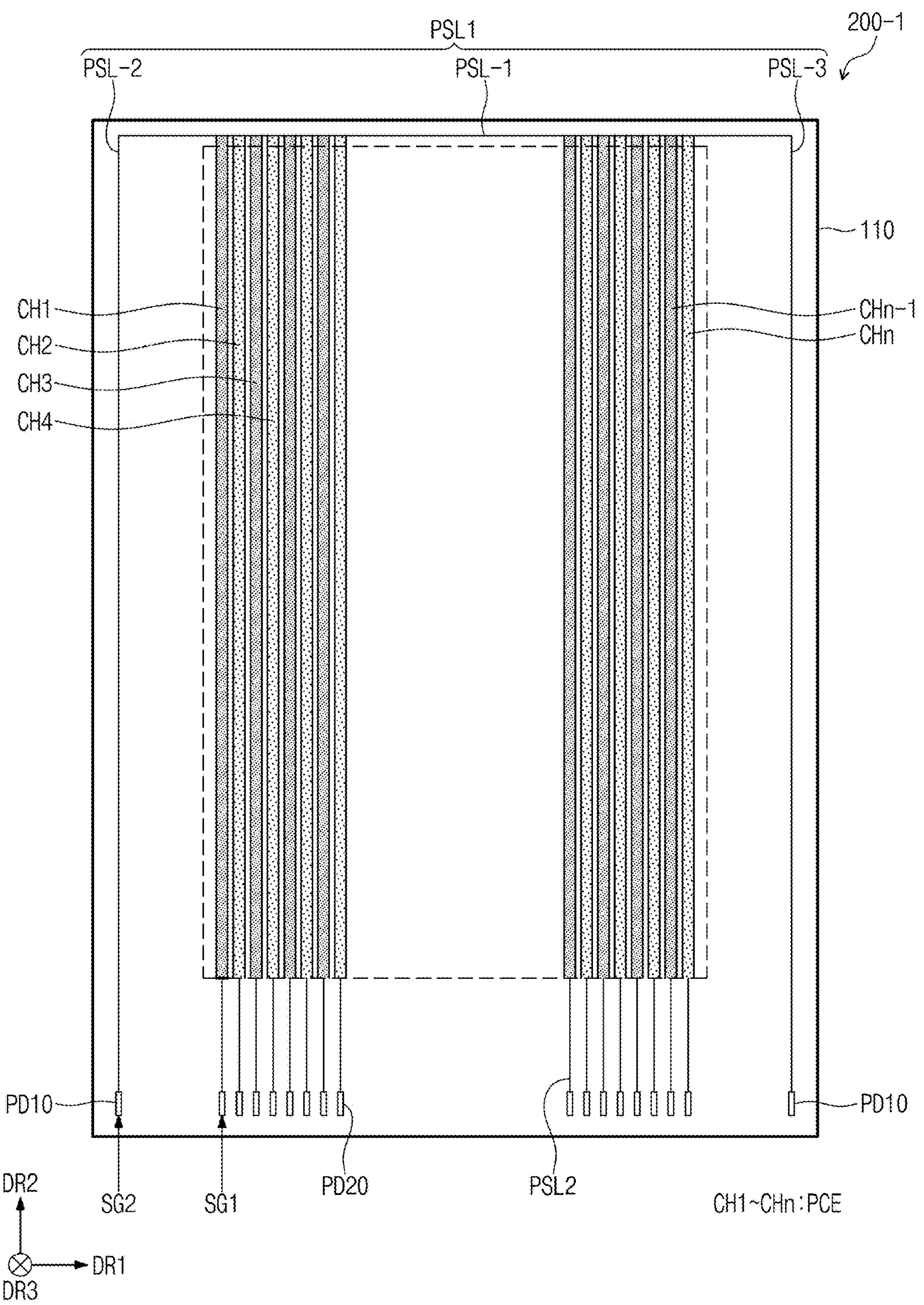
FIG. 17A is a plan view of a charging electrode layer according to an embodiment of the present disclosure.
Figure 17B:
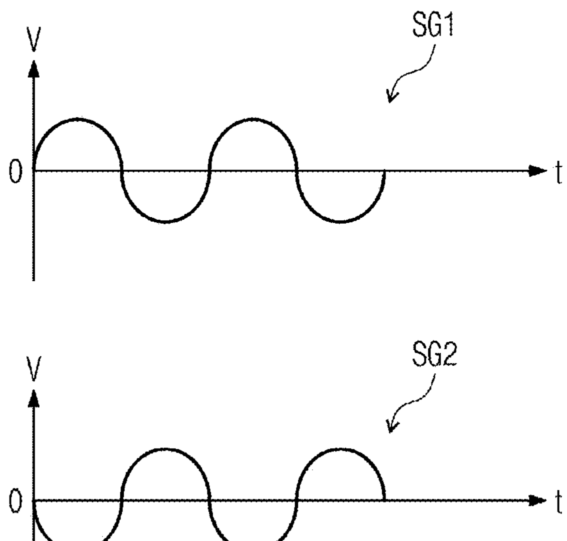
FIG. 17B illustrates graphs depicting the waveforms of a first signal and a second signal in a second mode according to an embodiment of the present disclosure.

FIG. 17A is a plan view of the charging electrode layer 200-1 according to an embodiment of the present disclosure. FIG. 17B illustrates graphs depicting the waveforms of a first driving signal SG1 and a second driving signal SG2 in the second mode according to an embodiment of the present disclosure. FIGS. 17C and 17D are tables showing signals provided to the charging electrode layer 200-1 according to an embodiment of the present disclosure.

Referring to FIG. 17A, the charging electrode layer 200-1 includes a charging electrode PCE, a first signal line PSL1, and second signal lines PSL2. The charging electrode PCE, the first signal line PSL1, and the second signal lines PSL2 are disposed on the rear surface of the base layer 110.

The charging electrode PCE may include a plurality of channels CH1 to CHn. N channels CH1 to CHn are illustrated as an example. Here, "n" is a natural number of 2 or more. The plurality of channels CH1 to CHn may include charging channels and non-charging channels. In this embodiment, the charging channels may include odd-numbered channels among the channels CH1 to CHn, and the non-charging channels may include even-numbered channels among the channels CH1 to CHn. However, the present disclosure is not limited thereto, and a plurality of non-charging channels may be disposed between adjacent charging channels.

The first signal line PSL1 may be connected to the plurality of channels CH1 to CHn. The first signal line PSL1 may include a first line portion PSL-1 that extends in the first direction DR1 and that is electrically connected to first ends of the channels CH1 to CHn, a second line portion PSL-2 extending from a first end of the first line portion PSL-1 in the second direction DR2, and a third line portion PSL-3 extending from a second end of the first line portion PSL-1 in the second direction DR2. Each of one end of the second line portion PSL-2 and one end of the third line portion PSL-3 is connected to a corresponding first charging pad PD10.

The second signal lines PSL2 may be connected to the plurality of channels CH1 to CHn in a one-to-one correspondence. That is, the number of second signal lines PSL2 may correspond to the number of channels CH1 to CHn. In FIG. 11, n second signal lines PSL2 are illustrated as an example.

The charging electrode layer 200-1 may operate during a charging drive mode of the second mode. Referring to FIG. 17A, in the charging drive mode, the sensor driver 200C (refer to FIG. 4) may apply the first driving signal SG1 to one pad among the first charging pads PD10 and second charging pads PD20 and may apply the second driving signal SG2 to another pad. For example, the sensor driver 200C may apply the first driving signal SG1 to a charging pad PD10 and apply the second driving signal SG2 to a charging pad PD20.

Referring to FIG. 17B, in an embodiment, the second driving signal SG2 is an inverse signal of the first driving signal SG1. For example, the first driving signal SG1 may be a sinusoidal signal. Each of the first driving signal SG1 and the second driving signal SG2 may be a square-wave signal. However, a relationship between the first driving signal SG1 and the second driving signal SG2 is not limited thereto. For example, in an embodiment of the present disclosure, when the first driving signal SG1 is a square-wave signal, the second driving signal SG2 may have a certain constant voltage.

Since the first driving signal SG1 and the second driving signal SG2 are applied to at least two pads, a current path is formed from one pad to another pad. In addition, when the first driving signal SG1 and the second driving signal SG2 are sinusoidal signals having an inverse phase relationship, the direction of electric current may be periodically varied.

Referring again to FIG. 17A, the first driving signal SG1 is provided to the first charging pad PD10 disposed on the left side, and the second driving signal SG2 is provided to the second charging pad PD20 connected to the leftmost charging channel CH1. Electric current may flow along a current path defined by the second line portion PSL-2, a portion of the first line portion PSL-1, and the leftmost charging channel CH1. The current path may have a coil form or shape. Accordingly, in the charging drive mode of the second mode, the RLC resonance circuit of the pen PN may be charged by a magnetic field induced by the current path. As described above, the second line portion PSL-2 may serve as a charging channel. The second line portion PSL-2 may produce the same effect as disposing a charging channel in the peripheral area 200NA. The third line portion PSL-3 may also produce the same effect. In an embodiment of the present disclosure, the second line portion PSL-2 and the third line portion PSL-3 are omitted. In this case, it is as if a charging channel is disposed only in the sensing area 200A.

The table of FIG. 17C shows signals in the charging drive mode based on the charging electrode layer 200-1 including the first to tenth channels CH1 to CH10. The signals provided to the second line portion PSL-2, the first to tenth channels CH1 to CH10, and the third line portion PSL-3 in first to sixth time intervals t1 to t6 are listed in the table of FIG. 17C. Among the first to tenth channels CH1 to CH10, the first, third, fifth, seventh, and ninth channels CH1, CH3, CH5, CH7, and CH9 correspond to charging channels. The entire region of the charging electrode layer 200-1 may be scanned.

During the first time interval t1, the second signal SG2 may be provided to the second line portion PSL-2, and the first driving signal SG1 may be provided to the first channel CH1. The second driving signal SG2 and the first driving signal SG1 may be interchanged and provided to the second line portion PSL-2 and the first channel CH1. During the first time interval t1, the first driving signal SG1 and the second driving signal SG2 are not provided to the third line portion PSL-3 and the remaining channels CH2 to CH10. "FL" in the table of FIG. 17C means that the first driving signal SG1 or the second driving signal SG2 is not provided to a corresponding channel. Here, "FL" may represent a floating state.

During the second time interval t2, the second driving signal SG2 may be provided to the first channel CH1, and the first driving signal SG1 may be provided to the third channel CH3. Thereafter, during the third to sixth time intervals t3, t4, t5, and t6, the second charging signal SG2 and the first charging signal SG1 may be provided while being shifted by two channels. To generate an electromagnetic field having a certain intensity or more, non-charging channels may be disposed between charging channels to which the second driving signal SG2 and the first driving signal SG1 are provided or between the line portions PSL-2 and PSL-3 and charging channels.

In FIGS. 17A to 17C, it has been described that the charging channels and the non-charging channels are fixed. However, the present disclosure is not limited thereto. According to an embodiment of the present disclosure, the charging channels may be varied. As illustrated in FIG. 17D, the first to tenth channels CH1 to CH10 may be charging channels during the different time intervals. This is because the sensor driver 200C of FIG. 4 according to an embodiment, provides the second driving signal SG2 and the first driving signal SG1 to any two charging pads selected from the first charging pads PD10 and the second charging pads PD20 of FIG. 17A and does not provide the signals to the remaining pads.

Referring to the table of FIG. 17D, signals provided to the second line portion PSL-2, the first to tenth channels CH1 to CH10, and the third line portion PSL-3 in first to eleventh time intervals t1 to t11 are listed in the table of FIG. 17D.

During the first time interval t1, the second signal SG2 may be provided to the second line portion PSL-2, and the first driving signal SG1 may be provided to the first channel CH1. During the second time interval t2, the second driving signal SG2 may be provided to the first channel CH1, and the first driving signal SG1 may be provided to the third channel CH3. Thereafter, during the third to eleventh time intervals t3 to t11, the second charging signal SG2 and the first charging signal SG1 may be provided while being shifted by one channel. During the eleventh time interval t11, the second driving signal SG2 may be provided to the tenth channel CH10, and the first driving signal SG1 may be provided to the third line portion PSL-3.

Although it has been described that one non-charging channel is disposed between the charging channels to which the second driving signal SG2 and the first driving signal SG1 are provided or between the line portions PSL-2 and PSL-3 and the charging channels, the present disclosure is not limited thereto. According to an embodiment of the present disclosure, two or more non-charging channels may be disposed between two adjacent charging channels.

Although it has been described that each of the second driving signal SG2 and the first driving signal SG1 is provided to one charging channel, the present disclosure is not limited thereto. According to an embodiment of the present disclosure, the second driving signal SG2 is provided to two or more adjacent charging channels, and the first driving signal SG1 is provided to two or more adjacent charging channels. In this case, at least one non-charging channel may be disposed therebetween. As the time intervals pass, the second driving signal SG2 and the first driving signal SG1 may be provided while being shifted by one or more channels.

Figure 18A:
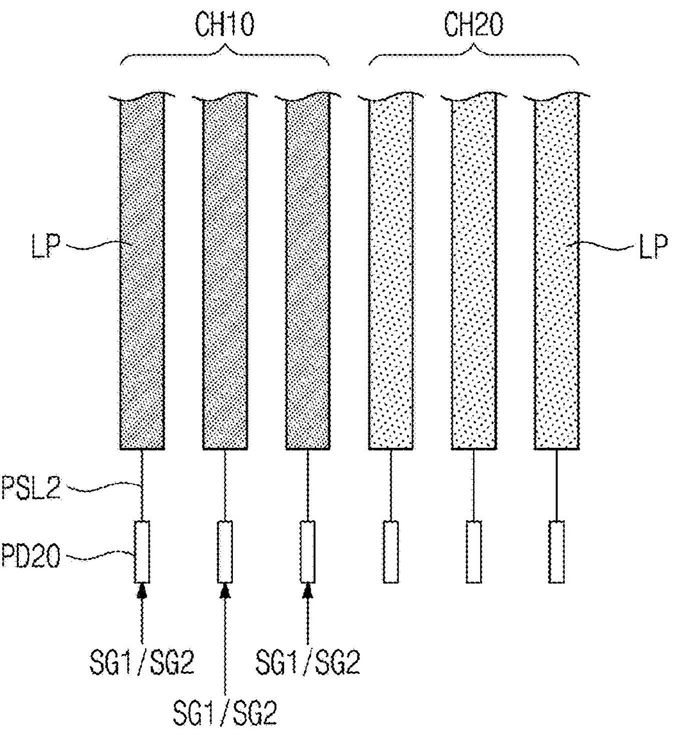
FIGS. 18A to 18C are plan views illustrating two adjacent channels according to an embodiment of the present disclosure.
Figure 18B:
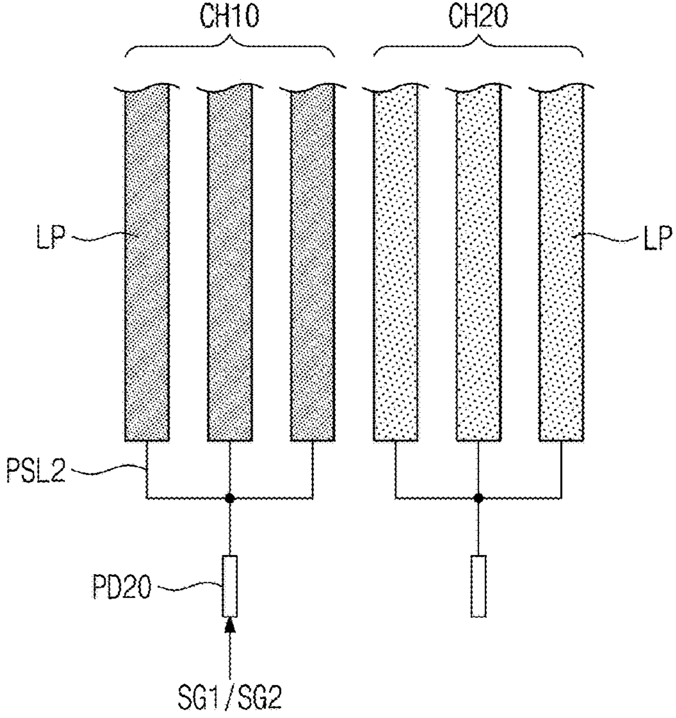
Figure 18C:
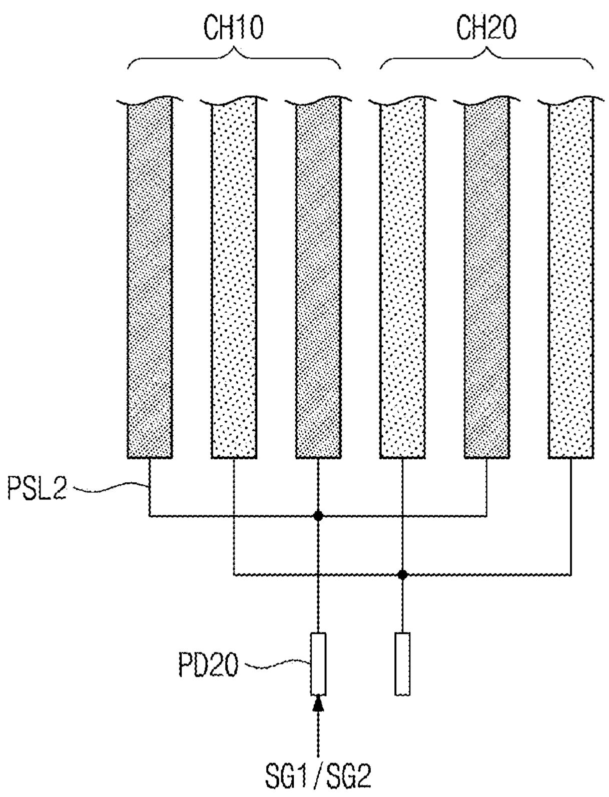
Figure 18D:
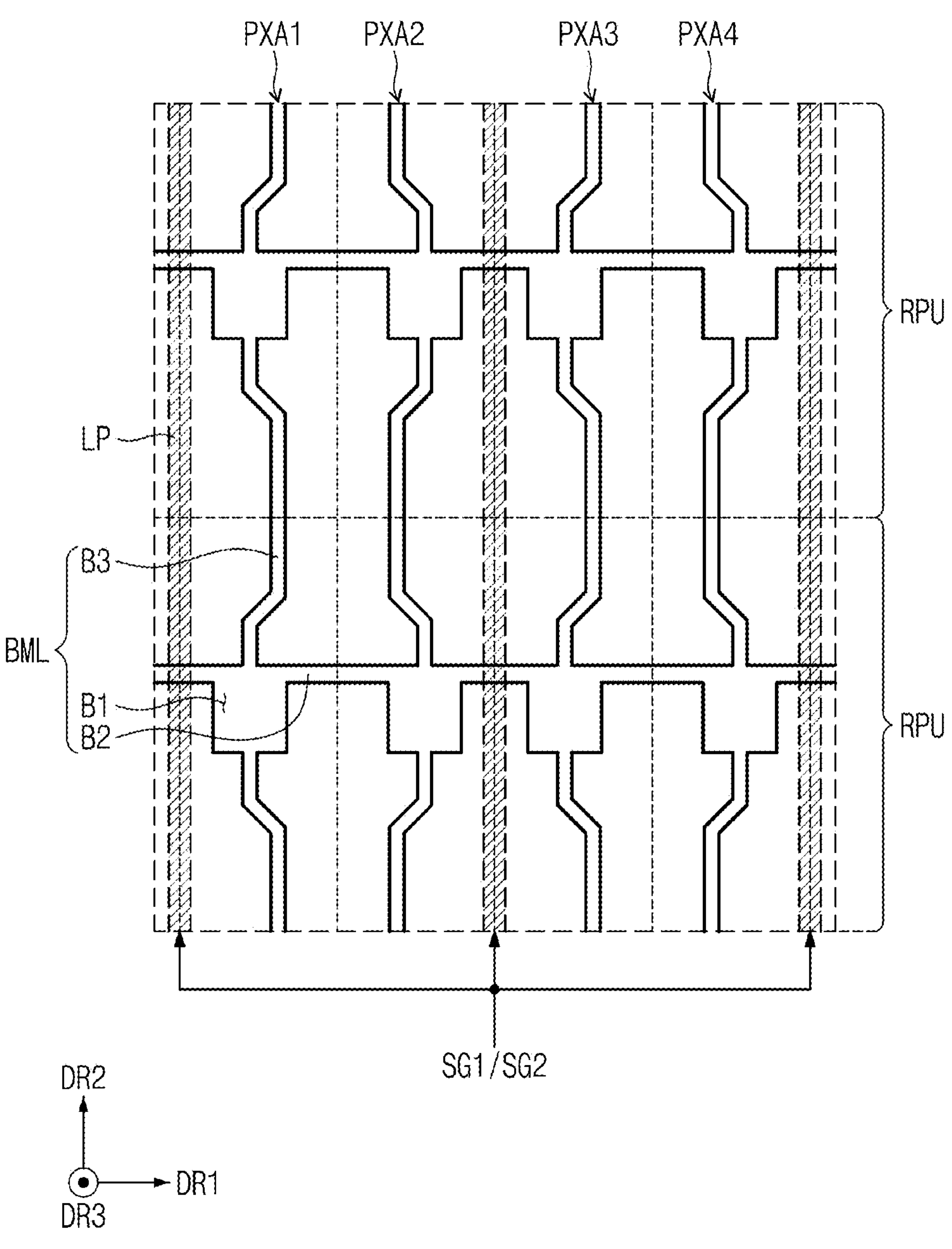
FIGS. 18D and 18E are plan views illustrating an arrangement of the shielding layer and the charging electrode of the display panel according to an embodiment of the present disclosure.
Figure 18E:
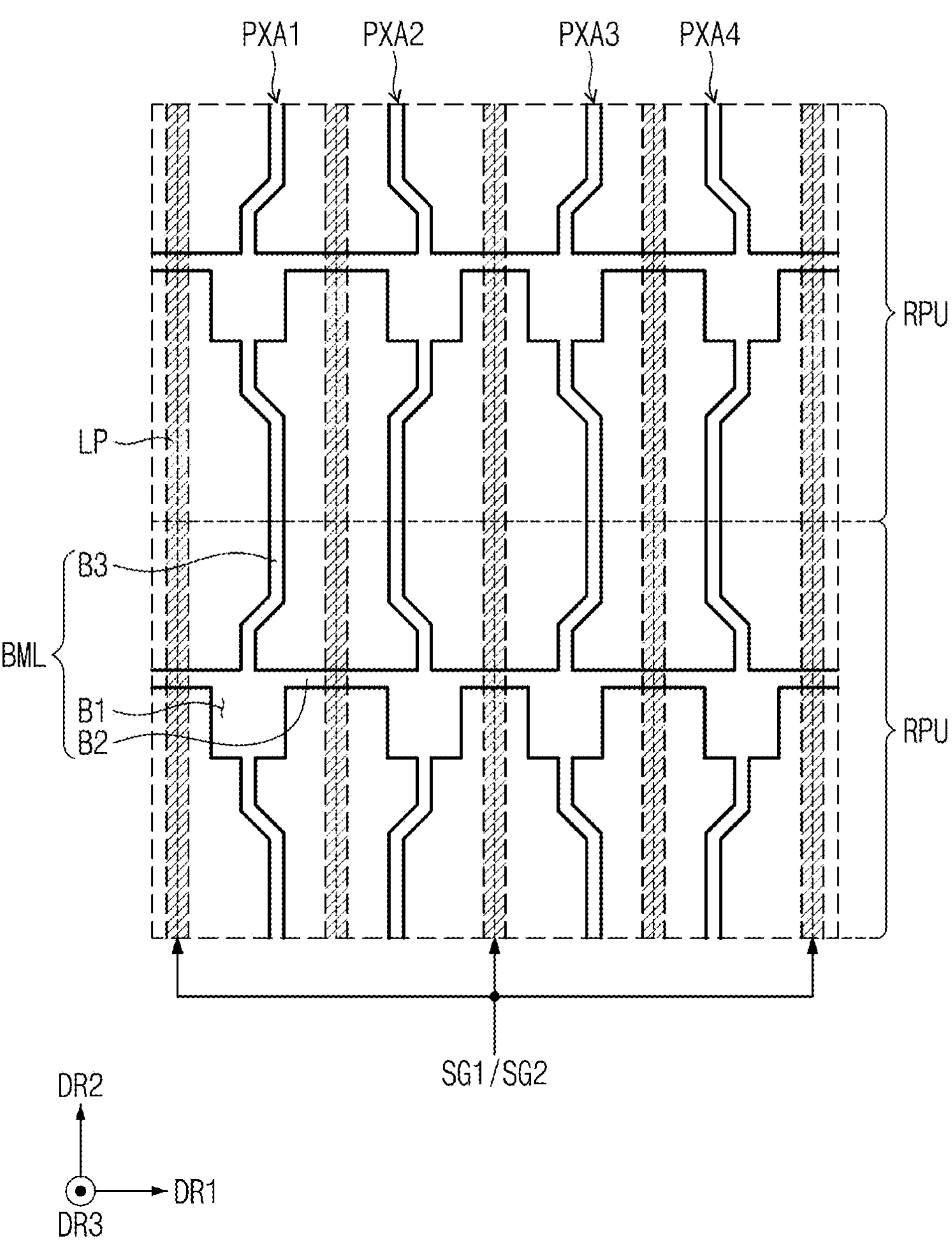

FIGS. 18A to 18C are plan views illustrating two adjacent channels CH10 and CH20 according to an embodiment of the present disclosure. FIGS. 18D and 18E are plan views illustrating an arrangement of the shielding layer BML and the charging electrode PCE of the display panel according to an embodiment of the present disclosure.

For convenience of description, the two channels CH10 and CH20 illustrated in FIGS. 18A to 18C are described as the first channel CH10 and the second channel CH20. Each of the first channel CH10 and the second channel CH20 may include a plurality of line portions LP. Although each of the first channel CH10 and the second channel CH20 is illustrated as including three line portions LP that are the same as one another, the present disclosure is not limited thereto. For example, in an alternate embodiment, the first channel CH10 and the second channel CH20 include different numbers of line portions LP.

Referring to FIG. 18A, the line portions LP of each of the first channel CH10 and the second channel CH20 are connected to corresponding second charging pads PD20. The second charging pads PD20 arranged to correspond to the line portions LP in a one-to-one manner are illustrated as an example.

During the charging drive mode, the line portions LP of the first channel CH10 may receive the same signal. The line portions LP of the first channel CH10 may receive the first driving signal SG1 or the second driving signal SG2. The line portions LP of the second channel CH20 may not receive a signal. Hereinafter, lines that receive a driving signal, such as the line portions LP of the first channel CH10, may be referred to as a first group of line portions, and lines that do not receive a driving signal, such as the line portions LP of the second channel CH20, may be referred to as a second group of line portions.

Since the line portions LP to which a signal is applied define the first channel CH10 and the line portions LP to which a signal is not applied define the second channel CH20, the widths of the channels may be controlled. In addition, when a signal is applied to odd-numbered line portions LP, the odd-numbered line portions LP may define the first channel CH10.

Referring to FIG. 18B, the line portions LP of the first channel CH10 are connected to the same second charging pad PD20. The line portions LP of the second channel CH20 are connected to the same second charging pad PD20. In this case, the line portions LP connected to at least the same charging pad define the same channel.

Referring to FIG. 18C, odd-numbered line portions LP are connected to the same second charging pad PD20 and may define the first channel CH10. Even-numbered line portions LP are connected to the same second charging pad PD20 and may define the second channel CH20.

FIGS. 18D and 18E are plan views for explaining differences from the embodiment of FIG. 8. Referring to FIG. 18D, a line portion LP is disposed on one side of each of the first to fourth pixel areas PXA1, PXA2, PXA3, and PXA4. A line portion LP is disposed on the left side of each of the first and third pixel areas PXA1 and PXA3, and a line portion LP is disposed on the right side of each of the second and fourth pixel areas PXA2 and PXA4. The line portions LP may define the same channel.

Referring to the first and second pixel areas PXA1 and PXA2 of FIGS. 6, 9, and 18D, the driving transistor T1 is disposed in each of the first and second pixel areas PXA1 and PXA2. The driving transistors T1 in the first and second pixel areas PXA1 and PXA2 do not overlap the line portion LP disposed on the left side of the first pixel area PXA1 (hereinafter, referred to as the first line portion) and the line portion LP disposed on the right side of the second pixel area PXA2 (hereinafter, referred to as the second line portion). The first areas B1 of the shielding layer BML disposed in the first and second pixel areas PXA1 and PXA2 do not overlap the first and second line portions LP.

The second line portion LP is disposed between the driving transistor T1 in the second pixel area PXA2 and the driving transistor T1 in the third pixel area PXA3. The driving transistors T1 in the third and fourth pixel areas PXA3 and PXA4 are disposed between the second line portion LP and the line portion LP disposed on the right side of the fourth pixel area PXA4 (hereinafter, referred to as the third line portion).

In this embodiment, the first to third line portions are all illustrated as receiving the same driving signal SG1 or SG2. However, the present disclosure is not limited thereto. Among the first to third line portions, only the odd-numbered line portions may receive the driving signal SG1 or SG2, or only the even-numbered line portion may receive the driving signal SG1 or SG2.

In FIG. 18E, five line portions LP (hereinafter, referred to as the first to fifth line portions) are illustrated. Referring to FIGS. 6, 9, and 18E, a corresponding line portion among the first to fifth line portions may be disposed between the driving transistors T1 in two adjacent pixel areas among the first to fourth pixel areas PXA1, PXA2, PXA3, and PXA4.

Even though the line portions LP are disposed on the opposite sides of each of the first to fourth pixel areas PXA1, PXA2, PXA3, and PXA4, some of the line portions LP may define the same charging channel. Although only the odd-numbered line portions LP of FIG. 18E are illustrated as defining the same charging channel, line portions LP for defining the same charging channel may be randomly selected.

FIGS. 19A to 19D are plan views of the charging electrode PCE according to an embodiment of the present disclosure.

Figure 19A:
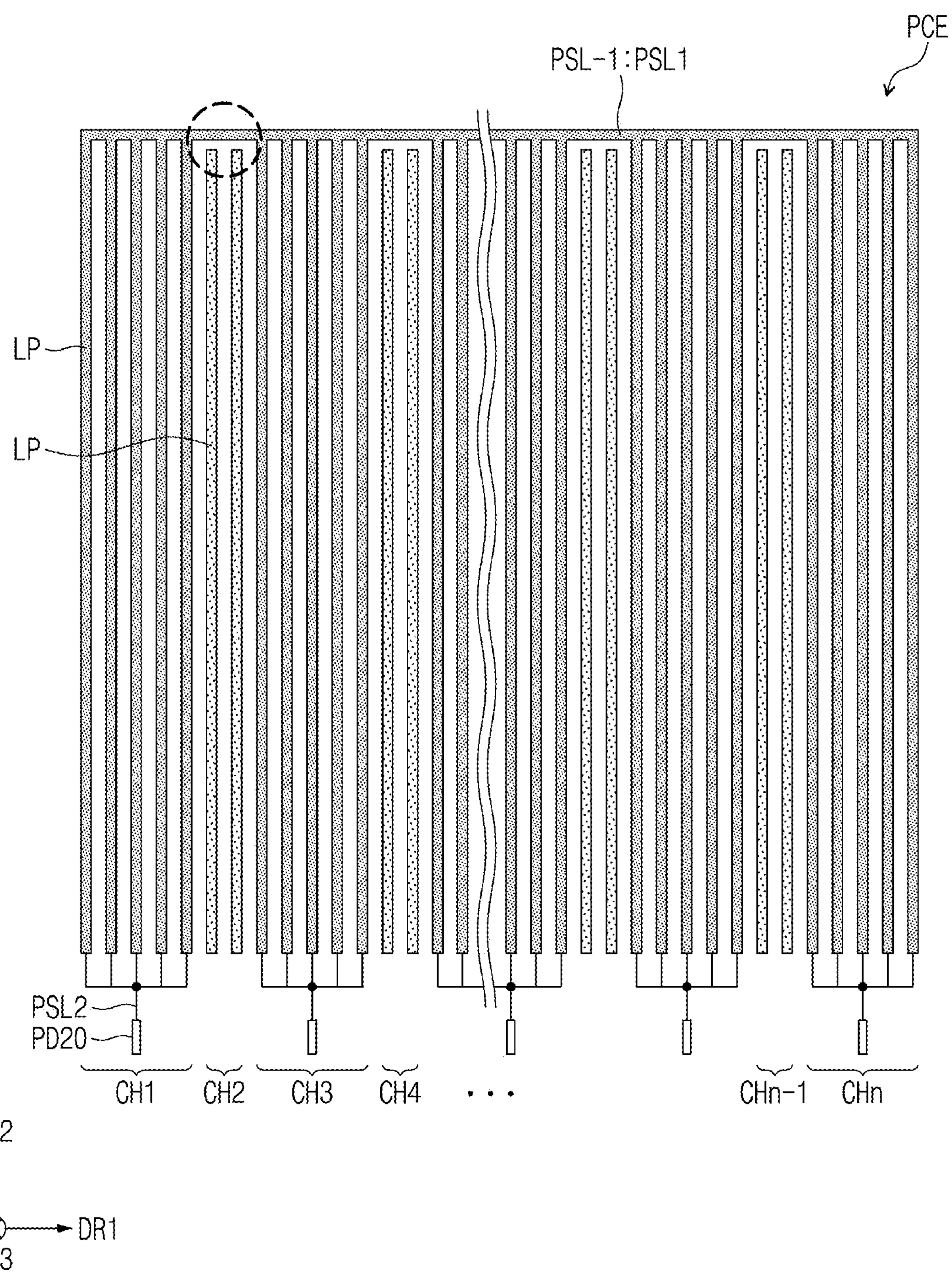
FIGS. 19A to 19D are plan views of the charging electrode according to an embodiment of the present disclosure.

Referring to FIG. 19A, some of the line portions LP are connected to the first signal line PSL1 to define charging channels, and the other line portions LP are spaced apart from the first signal line PSL1 to define non-charging channels as illustrated in the dotted line of FIG. 19A. In FIG. 19A, the first signal line PSL1 including only the first line portion PSL-1 is illustrated as an example.

Among the plurality of channels CH1 to CHn, odd-numbered channels define charging channels, and even-numbered channels define non-charging channels. Although the charging channels and the non-charging channels including different numbers of line portions LP are illustrated, the present disclosure is not limited thereto. For example, while FIG. 19A illustrates a charging channel including four line portions and a non-charging channel include two line portions, in other embodiments, the charging channel may include less than or more than four line portions and the non-charging channel may include less than or more than two line portions.

Figure 19B:
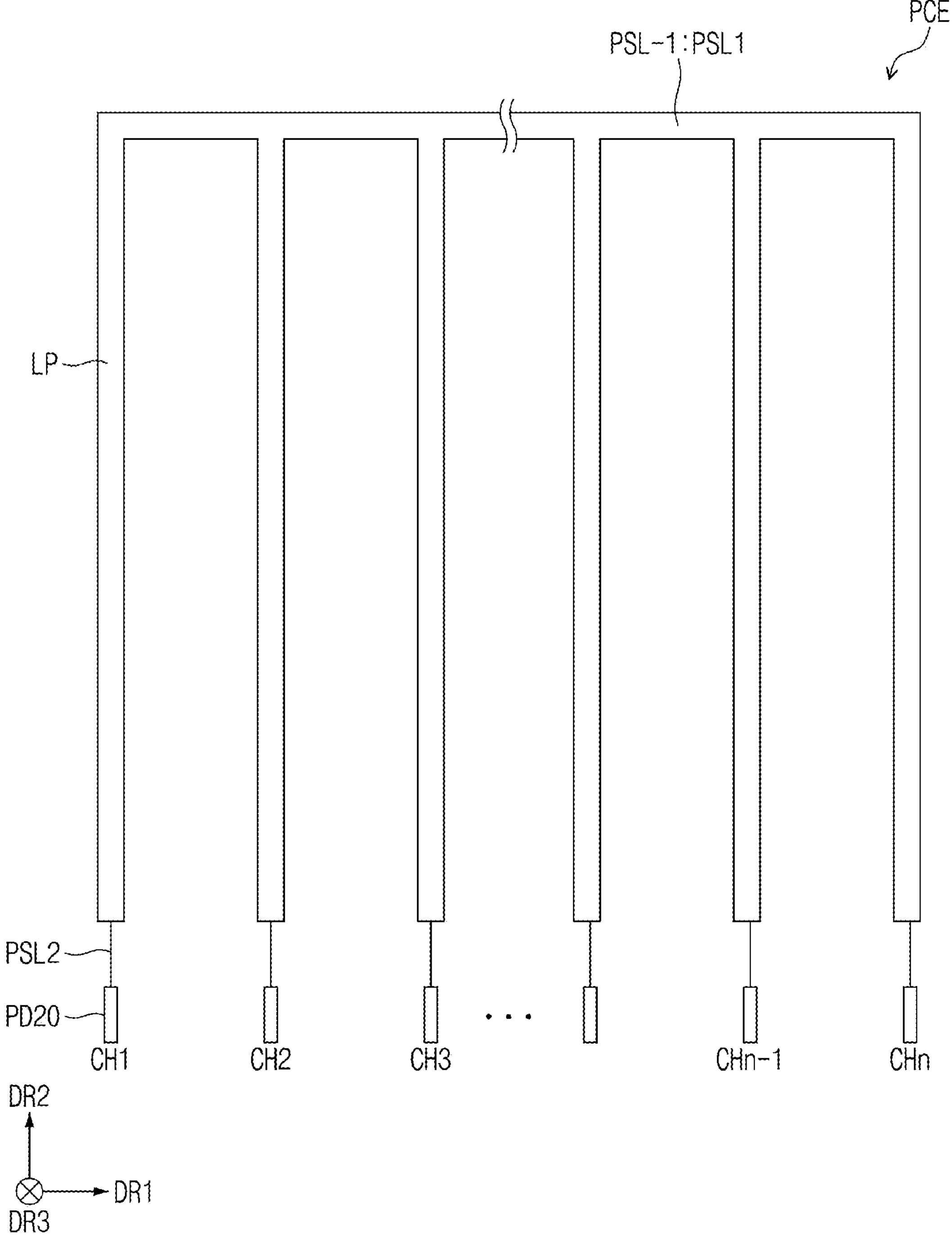

Referring to FIG. 19B, the plurality of channels CH1 to CHn are all charging channels, but adjacent charging channels are spaced apart from each other at a certain interval. Here, the certain interval means an interval greater than the interval between the two adjacent line portions LP described with reference to FIG. 8. Line portions LP are not disposed in the area between the adjacent charging channels. For example, line portions LP corresponding to one or more non-charging channels are not disposed between the adjacent charging channels.

In an embodiment, the interval between the adjacent charging channels is greater than the widths of the charging channels in the first direction DR1. In FIG. 19B, one line portion LP is illustrated as defining one charging channel. However, the present disclosure is not limited thereto.

Figure 19C:
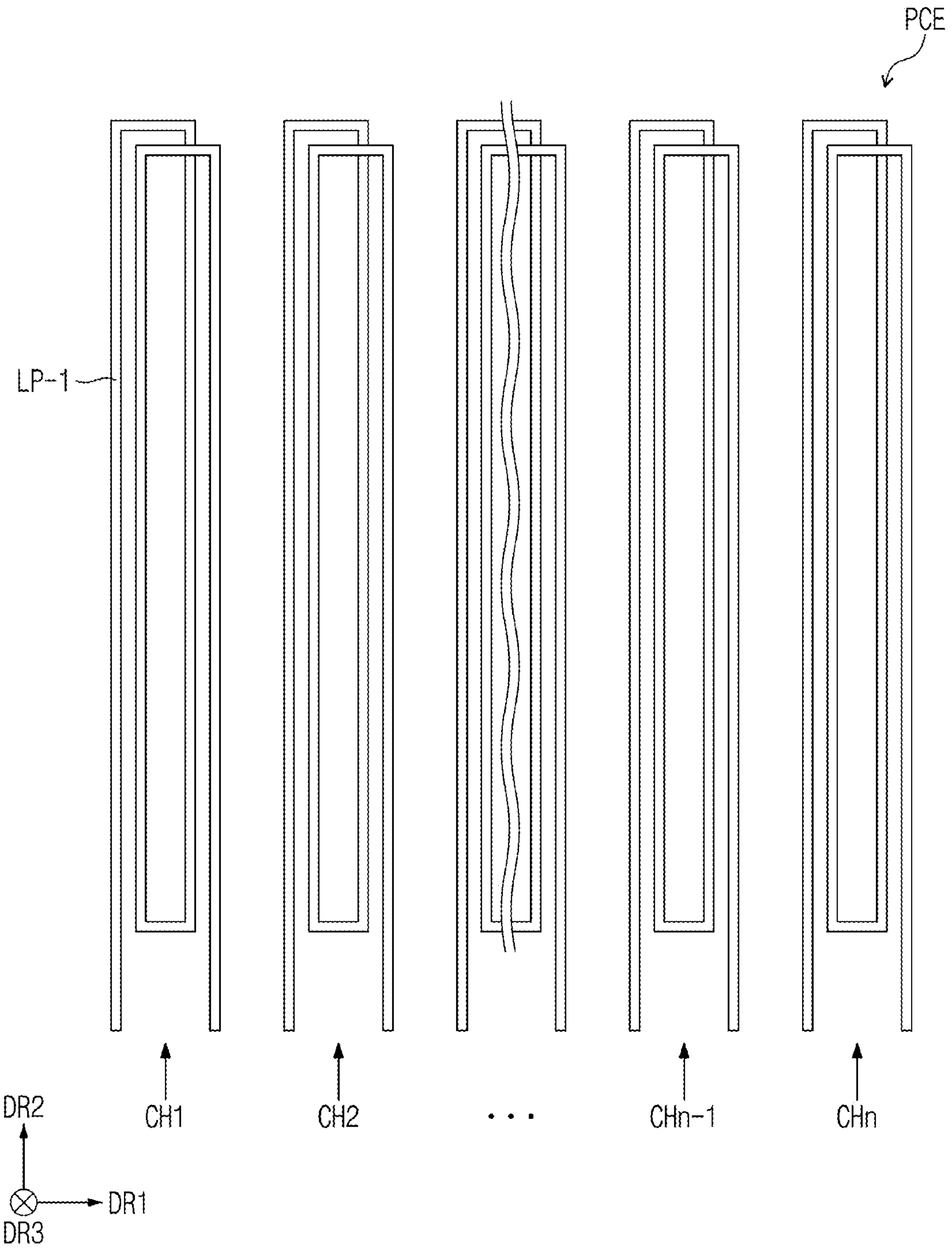

Referring to FIG. 19C, the charging electrode PCE includes the plurality of charging channels CH1 to CHn. The charging channels CH1 to CHn are spaced apart from each other, and each of the charging channels CH1 to CHn defines a coil. One charging channel is defined by one line portion LP-1, and the line portion LP-1 may have a loop shape wound twice. In an embodiment, the loop shape includes a first portion extending in the second direction DR2, a second portion extending in the first direction DR and connected to an end of the first portion, a third portion extending in a direction opposite to the second direction DR2 and connected to an end of the second portion, a fourth portion extending in a direction opposite to the first direction DR1, a fifth portion extending in the second direction DR2 and connected to an end of the fourth portion, a sixth portion extending in the first direction DR1, connected to an end of the fifth portion and overlapping the third portion, and a seventh portion extending in the direction opposite to the second direction DR2 and connected to the sixth portion.

Figure 19D:
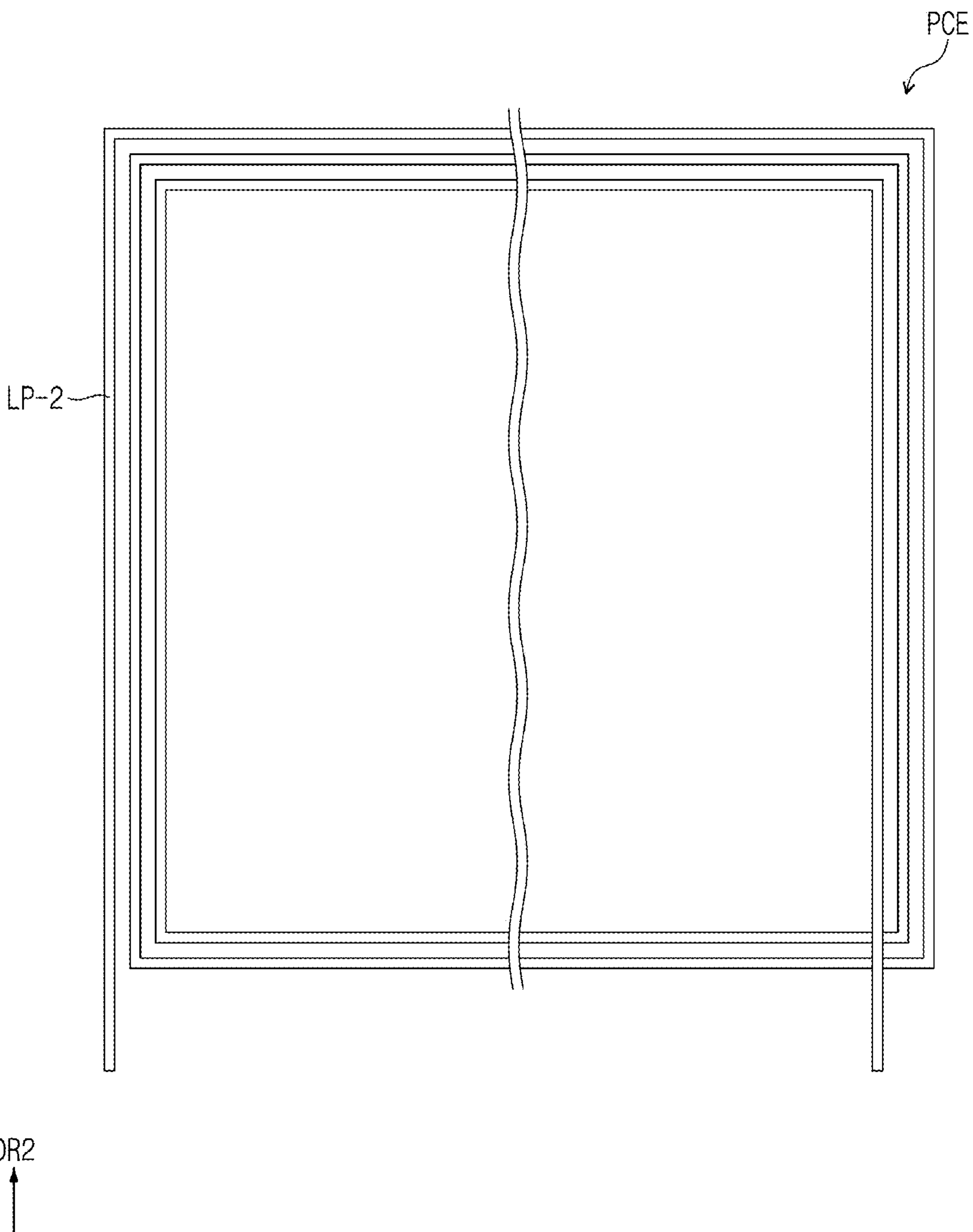

Referring to FIG. 19D, the charging electrode PCE includes a single charging channel. The single charging channel is defined by a single line portion LP-2. In this embodiment, the line portion LP-2 has a loop shape wound a plurality of times.

Figure 20A:
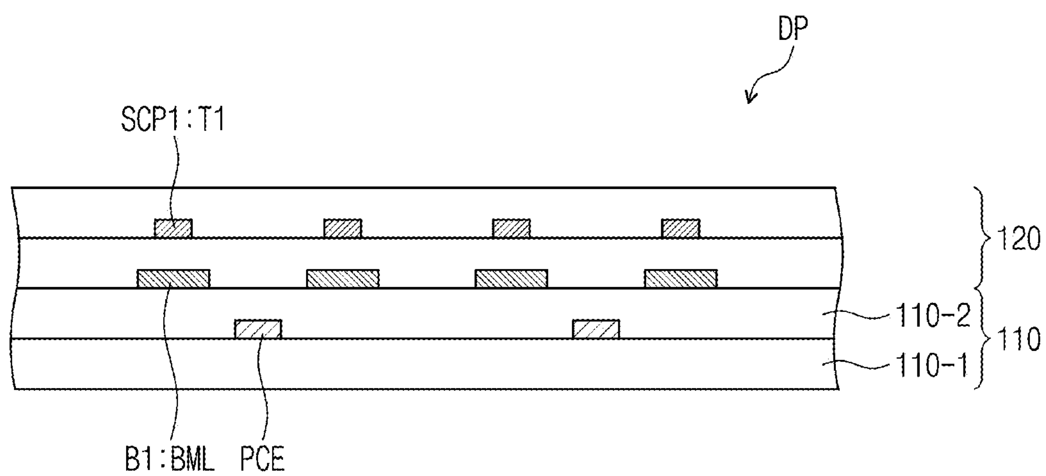
FIGS. 20A and 20B are sectional views of the display panel according to an embodiment of the present disclosure.
Figure 20B:
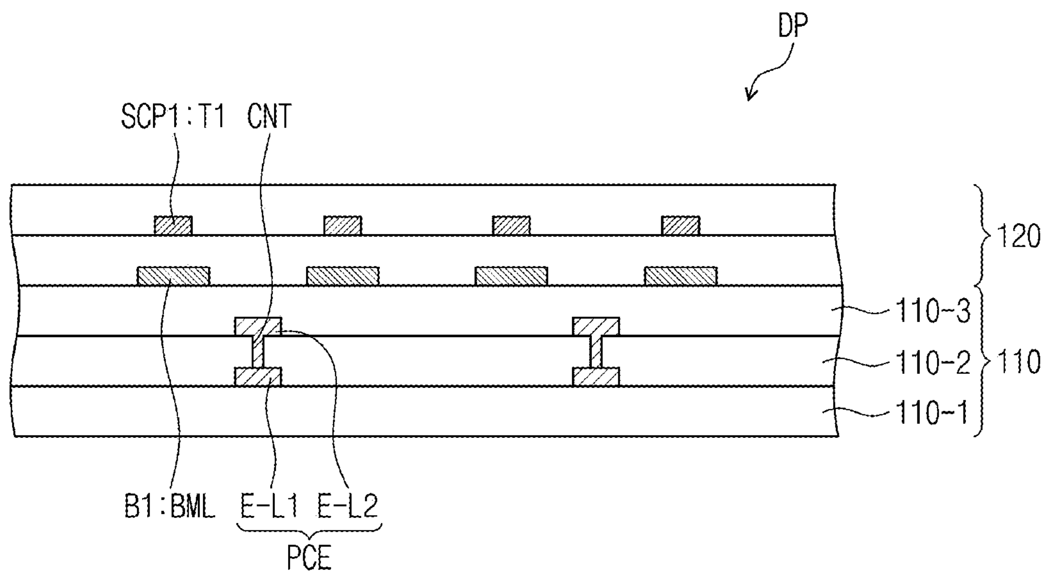

FIGS. 20A and 20B are sectional views of the display panel DP according to an embodiment of the present disclosure.

In FIGS. 20A and 20B, the base layer 110 and the drive circuit layer 120 of the display panel DP are illustrated, and the drive circuit layer 120 is more simply illustrated than that in FIG. 7. As illustrated in FIGS. 20A and 20B, the charging electrode PCE may be disposed in the base layer 110. The base layer 110 may include a plurality of resin layers. The plurality of resin layers may include a polymer such as polyimide.

As illustrated in FIG. 20A, the base layer 110 may include a first resin layer 110-1 and a second resin layer 110-2. The charging electrode PCE may be disposed between the first resin layer 110-1 and the second resin layer 110-2. An inorganic layer may be additionally disposed between the first resin layer 110-1 and the second resin layer 110-2, and the inorganic layer may cover the charging electrode PCE. In an embodiment, the charging electrode PCE does not overlap the first area B1 of the shielding layer BML and the first semiconductor pattern area SCP1 of the driving transistor T1. For example, in an embodiment, the charging electrode PCE does not overlap the first area B1 of the shielding layer BML and the first semiconductor pattern area SCP1 in a plan view.

As illustrated in FIG. 20B, the base layer 110 may include a first resin layer 110-1, a second resin layer 110-2, and a third resin layer 110-3. The charging electrode PCE may have a multi-layer structure. A first layer E-L1 of the charging electrode PCE is disposed between the first resin layer 110-1 and the second resin layer 110-2, and a second layer E-L2 of the charging electrode PCE is disposed between the second resin layer 110-2 and the third resin layer 110-3. The first layer E-L1 and the second layer E-L2 are connected through a contact hole CNT penetrating the second resin layer 110-2. The charging electrode PCE having the multi-layer structure may have low resistance. Accordingly, a large current may flow through the charging electrode PCE, and a large magnetic field may be induced. In an embodiment, the resistance of the charging electrode PCE is substantially lower than the resistance of any of the resin layers 110-1, 110-2, and 110-3.

Figure 21A:
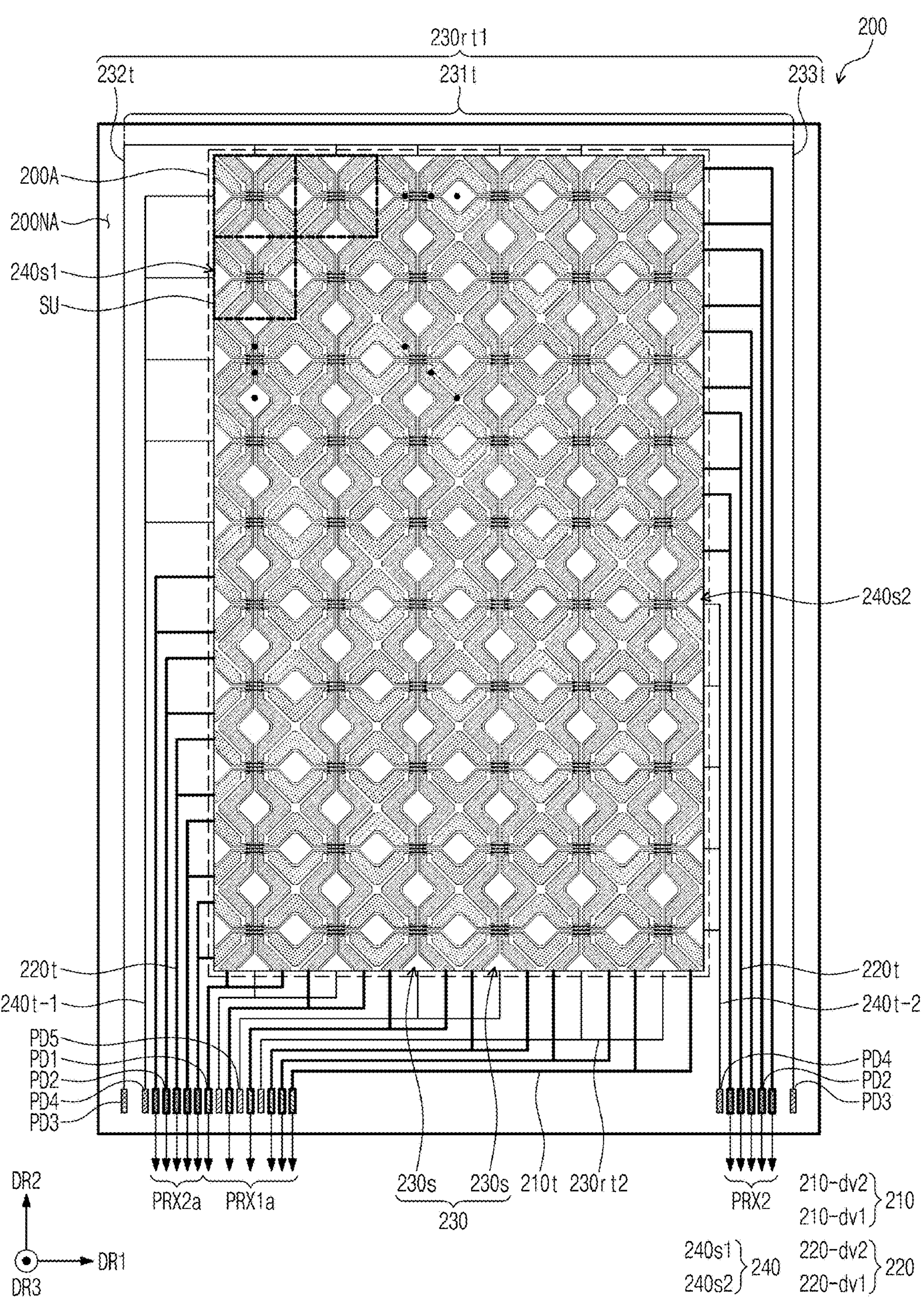
FIG. 21A is a view illustrating the second mode according to an embodiment of the present disclosure.
Figure 21B:
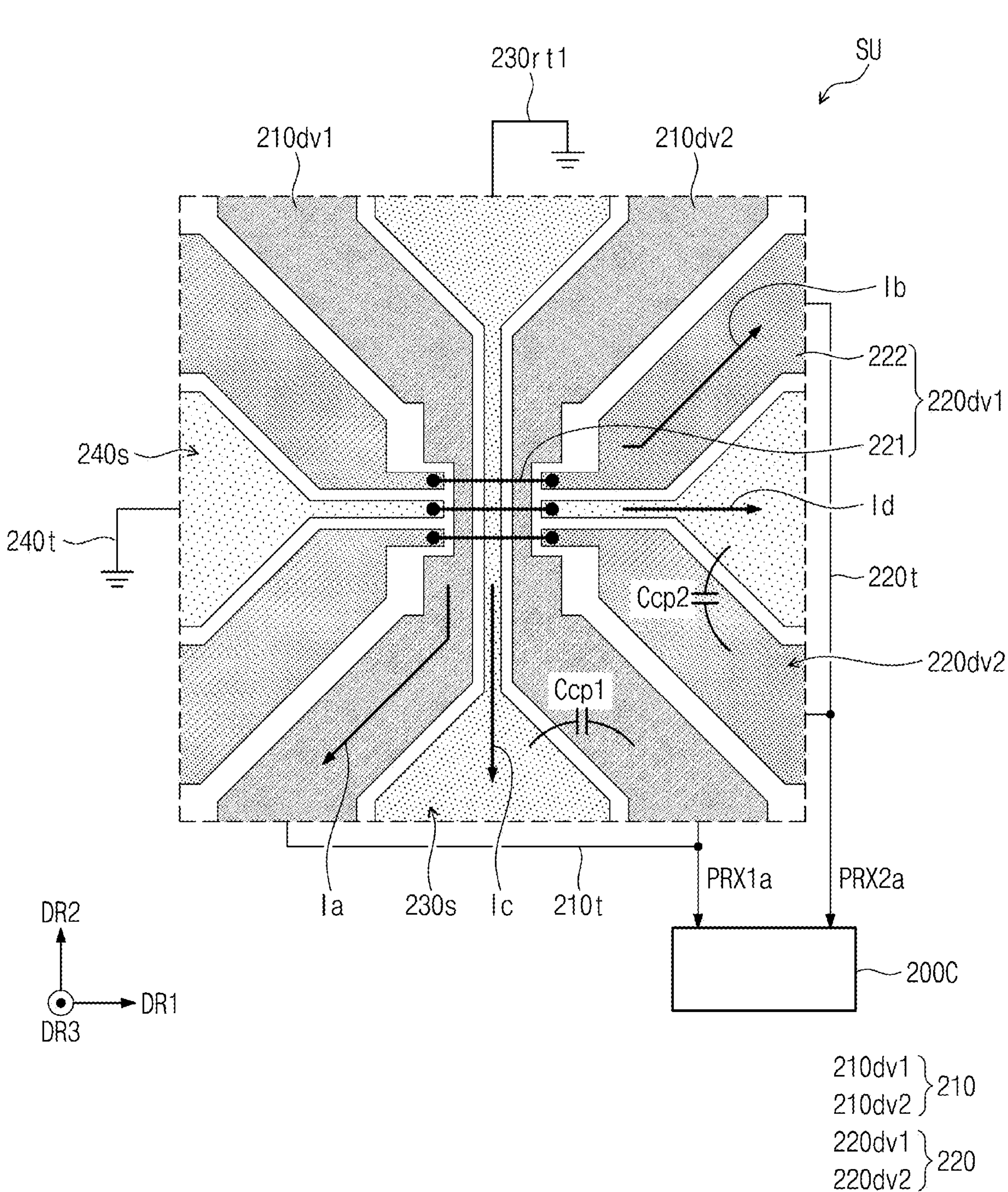
FIG. 21B is a view illustrating the second mode based on a sensing unit according to an embodiment of the present disclosure.

FIG. 21A is a view for explaining the second mode according to an embodiment of the present disclosure. FIG. 21B is a view for explaining the second mode based on a sensing unit SU according to an embodiment of the present disclosure.

FIGS. 21A and 21B are views for explaining a pen sensing drive mode. In FIG. 21B, one sensing unit SU through which first to fourth induced currents Ia, Ib, Ic, and Id generated by the pen PN flow is illustrated.

The RLC resonance circuit of the pen PN may emit a magnetic field having a resonant frequency while discharging charged charges. Due to the magnetic field provided by the pen PN, the first induced current Ia may be generated in the first electrode 210, and the second induced current Ib may be generated in the second electrode 220. In addition, the third induced current Ic may be generated in the first auxiliary electrode 230*s* of the third electrode 230, and the fourth induced current Id may be generated in the second auxiliary electrode 240*s* of the fourth electrode 240.

A first coupling capacitor Ccp1 may be formed between the first auxiliary electrode 230*s* and the first electrode 210, and a second coupling capacitor Ccp2 may be formed between the second auxiliary electrode 240*s* and the second electrode 220. The third induced current Ic may be transferred to the first electrode 210 through the first coupling capacitor Ccp1, and the fourth induced current Id may be transferred to the second electrode 220 through the second coupling capacitor Ccp2.

The sensor driver 200*c* may receive a first reception signal PRX1*a* based on the first induced current Ia and the third induced current Ic from the first electrode 210 and may receive a second reception signal PRX2*a* based on the second induced current Ib and the fourth induced current Id from the second electrode 220. The sensor driver 200C may detect the input coordinates of the pen PN, based on the first reception signal PRX1*a* and the second reception signal PRX2*a*.

In an embodiment, during the pen sensing drive mode, first ends of the third electrodes 230 and the fourth electrodes 240 are all floated. Accordingly, compensation of a sensing signal may be maximized by the coupling between the first electrodes 210 and the third electrodes 230 and the coupling between the second electrodes 220 and the fourth electrodes 240. Second ends of the third electrodes 230 and the fourth electrodes 240 may be grounded or floated. Accordingly, the third induced current Ic and the fourth induced current Id may be sufficiently transferred to the first electrodes 210 and the second electrodes 220 by the coupling between the first electrodes 210 and the third electrodes 230 and the coupling between the second electrodes 220 and the fourth electrodes 240.

In this embodiment, it has been described that the first reception signal PRX1*a* is transferred to the sensor driver 200C through the first trace line 210*t* and the second reception signal PRX2*a* is transferred to the sensor driver 200C through the second trace line 220*t*. However, the present disclosure is not limited thereto. In an embodiment of the present disclosure, the first reception signal PRX1*a* is transferred to the sensor driver 200C through the fifth trace line 230*rt*2, and the second reception signal PRX2*a* is transferred to the sensor driver 200C through the fourth trace line 240*t*-1. In an embodiment, the fifth trace line 230*rt*2 is separately connected to each first auxiliary electrode 230*s*, and the fourth trace line 240*t*-1 is separately connected to each second auxiliary electrode 240*s*.

Figure 22:
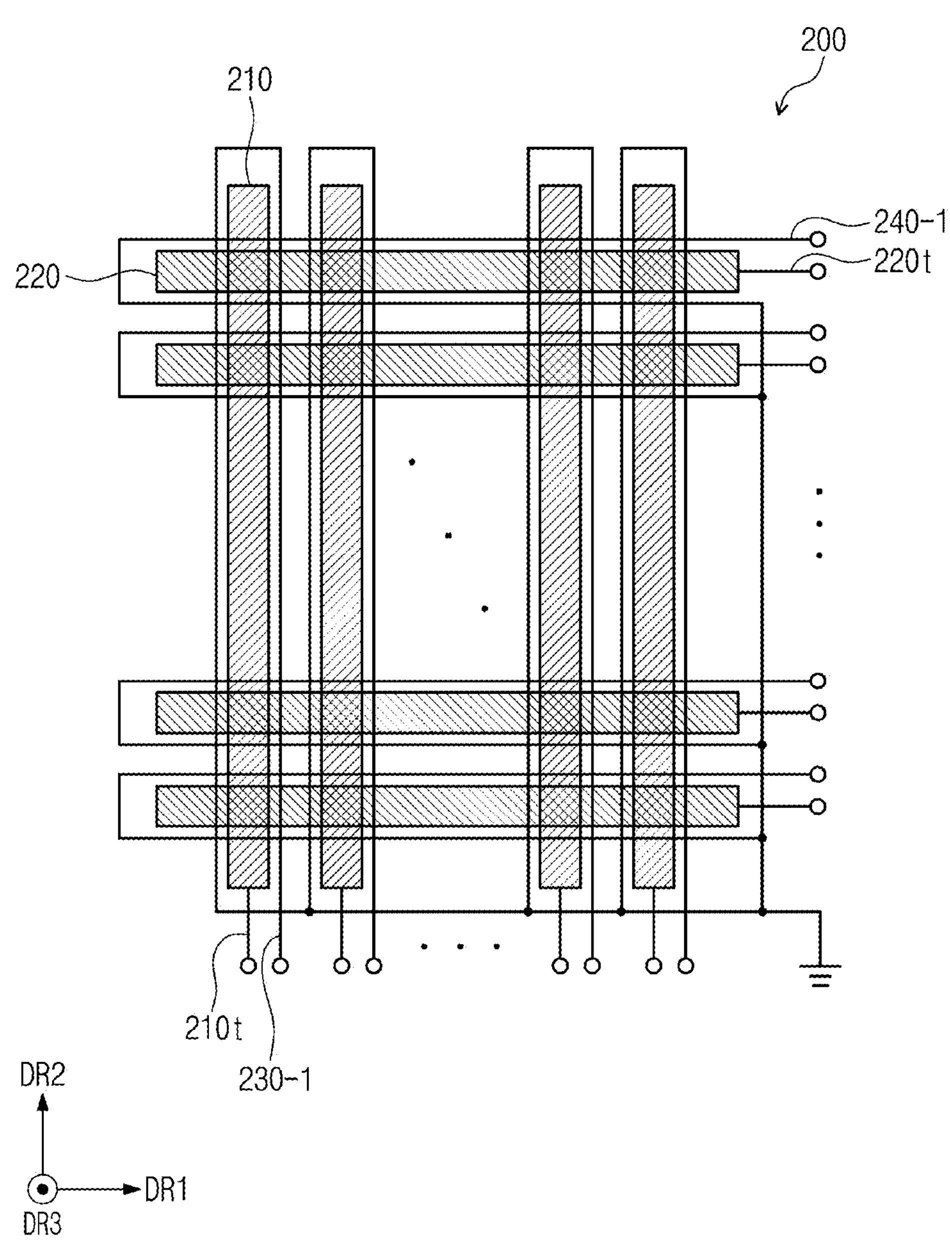
FIG. 22 is a plan view of the sensor layer according to an embodiment of the present disclosure.

FIG. 22 is a plan view of the sensor layer 200 according to an embodiment of the present disclosure.

The sensor layer 200 may include the first electrodes 210 and the second electrodes 220 crossing each other. The first trace lines 210*t* may be connected to the first electrodes 210, respectively, and the second trace lines 220*t* may be connected to the second electrodes 220, respectively.

The sensor layer 200 may include first coil electrodes 230-1 and second coil electrodes 240-1 crossing each other. The first coil electrodes 230-1 and the second coil electrodes 240-1 may each have a loop shape. The first coil electrodes 230-1, the second coil electrodes 240-1 and signal lines connected to the first and second coil electrodes 230-1 and 240-1 are illustrated as having a one-body shape without being distinguished from one another, but embodiments are not limited thereto. The first coil electrodes 230-1 may be disposed to correspond to the first electrodes 210, respectively, and the second coil electrodes 240-1 may be disposed to correspond to the second electrodes 220, respectively.

As described above, not only an input by a part of a user's body but also an input by a pen may be sensed. An input by a part of the user's body may be sensed using a capacitive method, and an input by a passive pen may be sensed using an electromagnetic induction method.

The charging electrode may be disposed in a layer different from the input sensor. Accordingly, the degree of freedom in the design of the charging electrode may be increased, and the charging electrode with reduced resistance may be formed. In addition, the charging electrode may generate an induced magnetic field with high intensity.

During the charging drive mode, interference between the charging electrode and the driving transistor may be prevented. Accordingly, deterioration in the display quality of the display panel may be prevented.

While the present disclosure has been described with reference to embodiments thereof, it will be apparent to those of ordinary skill in the art that various changes and modifications may be made thereto without departing from the spirit and scope of the present disclosure.

What is claimed is:

1. An electronic device comprising:

a base layer;

a first light emitting element disposed above the base layer;

a second light emitting element disposed adjacent to the first light emitting element in a row direction;

a first driving transistor disposed above the base layer and located on a current path between a power line and the first light emitting element;

a second driving transistor disposed above the base layer and located on a current path between the power line and the second light emitting element;

an input sensor disposed above the first light emitting element and the second light emitting element; and a charging electrode comprising a line portion disposed between the first driving transistor and the second driving transistor in the row direction, wherein the charging electrode is disposed below the first driving transistor and the second driving transistor, does not overlap the first driving transistor and the second driving transistor in a plan view, and is configured to generate an induced magnetic field.

2. The electronic device of claim 1, further comprising:

a shielding electrode disposed between the driving transistor and the charging electrode.

3. The electronic device of claim 2, wherein the shielding electrode is configured to receive a ground voltage or is floated.

4. The electronic device of claim 1, wherein the charging electrode is disposed below the base layer.

5. The electronic device of claim 1, wherein the base layer includes a first resin layer and a second resin layer disposed on the first resin layer, and wherein the charging electrode is disposed between the first resin layer and the second resin layer.

6. The electronic device of claim 1, wherein the charging electrode comprises:

a first layer;

a second layer disposed on the first layer; and an insulating layer disposed between the first layer and the second layer, wherein the first layer and the second layer are connected through a contact hole that penetrates the insulating layer.

7. The electronic device of claim 1, wherein the input sensor includes a first electrode and a second electrode crossing the first electrode.

8. The electronic device of claim 1, further comprising:

an input means, wherein the input sensor includes a third electrode and a fourth electrode crossing the third electrode, and wherein each of the third electrode and the fourth electrode generates an induced current by a magnetic field generated from the input means.

9. The electronic device of claim 8, wherein the input means includes a resistor-inductor-capacitor (RLC) resonance circuit charged by the induced magnetic field generated from the charging electrode.

10. The electronic device of claim 1, wherein the charging electrode comprises a plurality of line portions, and the plurality of line portions comprises the line portion disposed between the first driving transistor and the second driving transistor in the row direction.

11. The electronic device of claim 10, wherein the plurality of line portions comprise a first group of line portions and a second group of line portions, wherein the first group of line portions receive a driving signal, and wherein the second group of line portions do not receive a driving signal.

12. The electronic device of claim 11, wherein the first group of line portions define a plurality of charging channels, and wherein line portions of the respective charging channels are electrically connected with each other or receive a same driving signal.

13. The electronic device of claim 12, wherein the second group of line portions define a plurality of non-charging channels, and wherein the plurality of non-charging channels alternate with the plurality of charging channels.

14. The electronic device of claim 11, wherein the second group of line portions are disposed between the first group of line portions.

15. The electronic device of claim 10, wherein the plurality of line portions include a first group of line portions and a second group of line portions, wherein the first group of line portions receive a driving signal, and wherein the second group of line portions are floated.

16. An electronic device comprising:

a base layer including a first pixel area and a second pixel area arranged adjacent the first pixel area in a row direction;

a first light emitting element disposed above the base layer and corresponding to the first pixel area;

a second light emitting element disposed above the base layer and corresponding to the second pixel area;

a first driving transistor disposed above the base layer and overlapping the first pixel area, the first driving transistor being located on a current path between a power line and the first light emitting element;

a second driving transistor disposed above the base layer and overlapping the second pixel area, the second driving transistor being located on a current path between the power line and the second light emitting element;

an input sensor disposed above the first light emitting element and the second light emitting element; and a first line portion and a second line portion disposed below the first driving transistor and the second driving transistor, non-overlapping the first driving transistor and the second driving transistor in a plan view, wherein the first line portion and the second line portion are configured to generate an induced magnetic field, and one of the first line portion and the second line portion is disposed between the first driving transistor and the second driving transistor in the row direction.

17. The electronic device of claim 16, wherein the first line portion is disposed between the first driving transistor and the second driving transistor in the row direction, and wherein the first driving transistor or the second driving transistor is disposed between the first line portion and the second line portion in the row direction.

18. The electronic device of claim 17, wherein each of the first line portion and the second line portion receives a driving signal, or only one of the first line portion and the second line portion receives a driving signal.

19. The electronic device of claim 16, further comprising:

a signal line connected to the first line portion and the second line portion, wherein the input sensor includes a first electrode, a second electrode crossing the first electrode and capacitively coupled with the first electrode, a third electrode, and a fourth electrode crossing the third electrode, and each of the third electrode and the fourth electrode generates an induced current by a magnetic field generated from an input means.

* * * * *